United States Patent
Kim et al.

(10) Patent No.: US 12,012,272 B2
(45) Date of Patent: Jun. 18, 2024

(54) ANTI-SLIP PAD AND TRAY INCLUDING SAME

(71) Applicant: Samsung Display Co., LTD., Yongin-si (KR)

(72) Inventors: Sung Kim, Anyang-si (KR); Hyung Don Na, Seoul (KR); Hyeong Wook Im, Incheon (KR); Sang Woo Kim, Seoul (KR); Joo Yeob Kim, Seongnam-si (KR); Seung Kyu Lee, Hwaseong-si (KR); Ji Ho Chung, Gongju-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 198 days.

(21) Appl. No.: 17/470,416

(22) Filed: Sep. 9, 2021

(65) Prior Publication Data

US 2022/0097946 A1 Mar. 31, 2022

(30) Foreign Application Priority Data

Sep. 29, 2020 (KR) .......................... 10-2020-0126810

(51) Int. Cl.
- *B65D 85/48* (2006.01)
- *B32B 25/08* (2006.01)
- *B65D 81/05* (2006.01)

(52) U.S. Cl.
CPC .............. *B65D 81/05* (2013.01); *B32B 25/08* (2013.01); *B65D 85/48* (2013.01); *B32B 2307/21* (2013.01); *B32B 2439/02* (2013.01); *B65D 2581/055* (2013.01)

(58) Field of Classification Search
CPC ........... H01L 2924/0002; H01L 21/673; H01L 21/6734; H01L 21/67343; B32B 2274/00; B32B 2307/21; B32B 2307/744; B32B 2439/02; B32B 25/08; B32B 25/12; B32B 25/14; B32B 27/08; B32B 27/18; B32B 27/281; B32B 27/285; B32B 27/286; B32B 27/302; B32B 27/304; B32B 27/308; B32B 27/32; B32B 27/34; B32B 27/36; B32B 27/365; B32B 27/38; B32B 27/40; B32B 3/02; B32B 3/30; B65D 2581/055; B65D 81/05; B65D 85/48
See application file for complete search history.

(56) References Cited

FOREIGN PATENT DOCUMENTS

| CN | 106494723 | 3/2017 |
|----|-----------|--------|
| KR | 10-1548670 | 9/2015 |
| KR | 10-2085500 | 3/2020 |

OTHER PUBLICATIONS

CN 111306157 A (Hu), Jun. 19 (Year: 2020).*

* cited by examiner

*Primary Examiner* — Lawrence D Ferguson
(74) *Attorney, Agent, or Firm* — KILE PARK REED & HOUTTEMAN PLLC

(57) ABSTRACT

A tray assembly includes a base tray, and an anti-slip pad disposed on the base tray, wherein the anti-slip pad has a friction coefficient in a range of about 0.5 to about 20 based on ASTM D1894, and a surface resistance in a range of about $10^6$ $\Omega/cm^2$ to about $10^9$ $\Omega/cm^2$ based on ASTM D257, and the anti-slip pad includes at least one of a thermoplastic olefinic elastomer (TPO), natural rubber, styrene-butadiene rubber (SBR), and polypropylene (PP).

12 Claims, 29 Drawing Sheets

ANTI-SLIP PAD AND TRAY INCLUDING SAME

CROSS-REFERENCE TO RELATED APPLICATION(S)

This application claims priority to and benefits of Korean Patent Application No. 10-2020-0126810 under 35 U.S.C. § 119, filed on Sep. 29, 2020 in the Korean Intellectual Property Office, the entire contents of which are incorporated herein by reference.

BACKGROUND

1. Technical Field

The disclosure relates to an anti-slip pad and a tray assembly including the same.

2. Description of the Related Art

The importance of display devices has steadily increased with the development of multimedia technology. In response thereto, various types of display devices such as an organic light emitting display (OLED), a liquid crystal display (LCD) and the like have been used. Such display devices have been variously applied to various mobile electronic devices, for example, portable electronic devices such as a smart phone, a smart watch, and a tablet PC.

A display device may be transferred and stored while being loaded on a tray during various manufacturing processes. The tray may include a loading space for loading a display device to be loaded. In order to prevent the display device from being damaged during transfer, the loading space of the tray has a size corresponding to the size of the display device to be loaded. In case that the display device to be loaded moves in the loading space, the display device may be damaged by collision with neighboring components.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide an anti-slip pad having a high friction coefficient with respect to a loading target element, and a tray that may include the anti-slip pad and may be capable of stably loading a loading target element.

Aspects of the disclosure may provide a tray capable of minimizing deflection due to a pattern formed on a bottom surface portion.

However, aspects of the disclosure are not restricted to those set forth herein. The above and other aspects of the disclosure will become more apparent to one of ordinary skill in the art to which the disclosure pertains by referencing the detailed description of the disclosure given below.

An embodiment of a tray assembly may include a base tray, and an anti-slip pad disposed on the base tray, wherein the anti-slip pad may have a friction coefficient in a range of about 0.5 to about 20 based on ASTM D1894, and a surface resistance in a range of about $10^6$ $\Omega/cm^2$ to about $10^9$ $\Omega/cm^2$ based on ASTM D257, and the anti-slip pad may include at least one of a thermoplastic olefinic elastomer (TPO), natural rubber, styrene-butadiene rubber (SBR), and polypropylene (PP).

The anti-slip pad may further include a composite sheet that may include thermoplastic polymer resin, and a thermoplastic elastomer.

The composite sheet may include a base sheet, and non-slip sheets disposed on a surface and another surface of the base sheet.

The base sheet may include thermoplastic polymer resin, and the non-slip sheets may include a thermoplastic elastomer.

The base sheet may include at least one of polyester (PET A, PET G, PET G-PET A-PET G), styrene butadiene copolymer (SBC), acrylonitrile-butadiene styrene (ABS), polystyrene (PS), polyimide (PI), polyamide, polysulfonate, polycarbonate, polyacrylate, polyvinyl chloride, polyethylene, polypropylene, modified polyphenylene oxide (M-PPO), phenol resin, epoxy resin, urethane resin, copolymers thereof, and blends thereof.

The non-slip sheets may include at least one of a thermoplastic olefinic elastomer (TPO), natural rubber, styrene-butadiene rubber (SBR), and polypropylene (PP).

The tray assembly may further comprise an antistatic layer disposed on the composite sheet.

The antistatic layer may include at least one of polyaniline, polypyrrole, polythiophene, poly(3,4-ethylenethiophene), π-conjugated electrically conductive polymer, and inherently dissipative polymer (IDP).

The base tray may include a bottom surface portion including a pattern including a groove, and a sidewall surrounding the bottom surface portion.

The pattern may include a rib disposed in the groove, and a top surface of the rib and the bottom surface portion may be disposed on a same plane.

The pattern may include a cylindrical post disposed at a center of the groove, and a top surface of the cylindrical post and the bottom surface portion may be disposed on a same plane.

The base tray may have a rectangular shape with a horizontal length and a vertical length of about 400 mm to about 600 mm in plan view, and may have a deflection amount of less than about 1 mm.

An embodiment of an anti-slip pad may further include a base layer, a first non-slip layer disposed on a first surface of the base layer, and a second non-slip layer disposed on a second surface of the base layer, wherein the first non-slip layer and the second non-slip layer may include at least one of a thermoplastic olefinic elastomer (TPO), natural rubber, styrene-butadiene rubber (SBR), or polypropylene (PP).

The base layer may include thermoplastic polymer resin.

The base layer may include at least one of polyester (PET A, PET G, PET G-PET A-PET G), styrene butadiene copolymer (SBC), acrylonitrile-butadiene styrene (ABS), polystyrene (PS), polyimide (PI), polyamide, polysulfonate, polycarbonate, polyacrylate, polyvinyl chloride (PVC), polyethylene (PE), polypropylene (PP), modified polyphenylene oxide (M-PPO), phenol resin, epoxy resin, urethane resin, copolymers thereof, and blends thereof.

At least one of the first non-slip layer and the second non-slip layer may have a friction coefficient in a range of about 0.5 to about 20 based on ASTM D1894.

At least one of the first non-slip layer and the second non-slip layer may have a surface resistance in a range of about $10^6$ $\Omega/cm^2$ to about $10^9$ $\Omega/cm^2$ based on ASTM D257.

The anti-slip pad may further comprise an antistatic layer disposed on the first non-slip layer.

The antistatic layer may comprise thermosetting resin and an antistatic agent, and the thermosetting resin may include the antistatic agent in an amount of about 0.1 to about 500 parts by weight based on 100 parts by weight of the thermosetting resin.

The antistatic agent may include at least one of polyaniline, polypyrrole, polythiophene, poly(3,4-ethylenethiophene), π-conjugated electrically conductive polymer, and inherently dissipative polymer (IDP).

The anti-slip pad according to an embodiment may have a high friction coefficient with respect to a loading target element, so that it may be possible to prevent the loading target element from slipping.

The tray according to an embodiment may include an anti-slip pad having a high friction coefficient with respect to a loading target element, so that it may be possible to stably load the loading target element.

Further, the deflection of the tray may be minimized due to the formed pattern.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
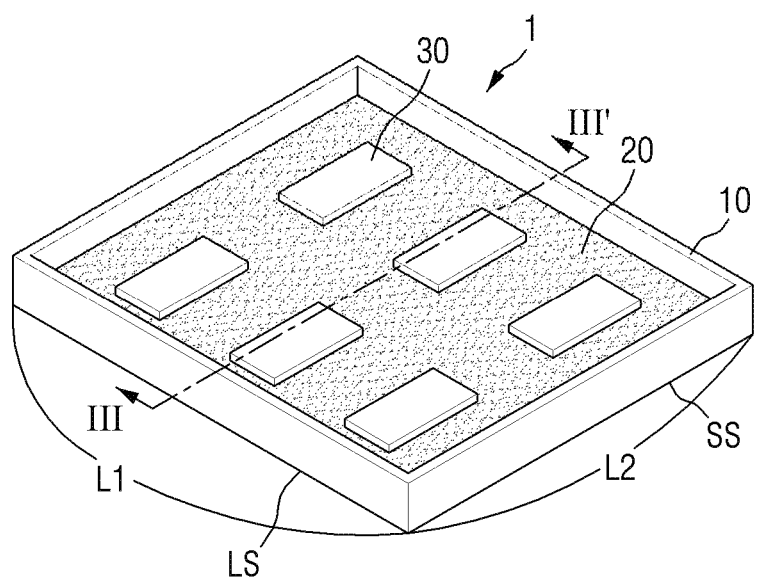
FIG. 1 is a schematic perspective view of a tray assembly according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. In contrast, when an element is referred to as being "directly on" another element, there may be no intervening elements present.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The same reference numbers indicate the same components throughout the specification.

"About", "approximately", and "substantially" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
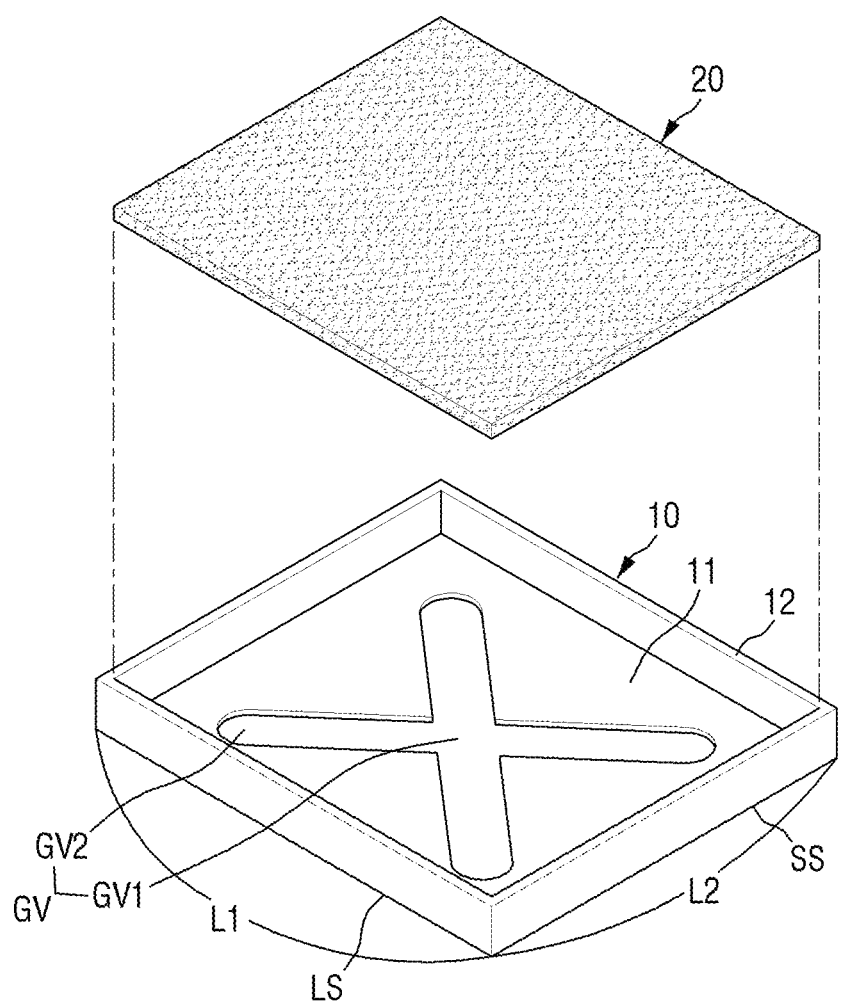
FIG. 2 is an exploded schematic perspective view of a tray assembly according to an embodiment.
Figure 3:
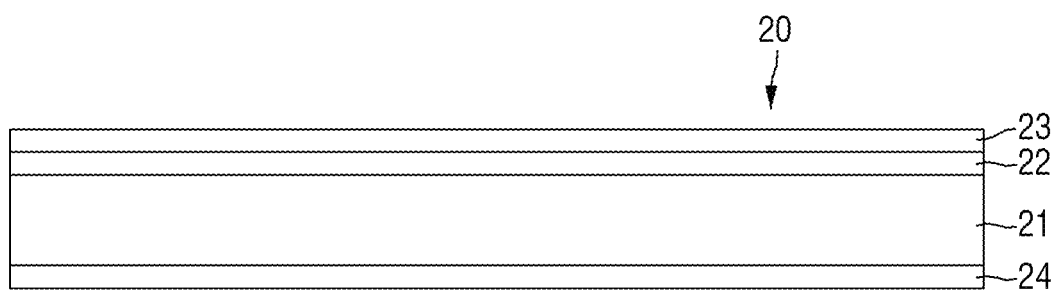
FIG. 3 is a schematic cross-sectional view of an anti-slip pad according to an embodiment.
Figure 4:
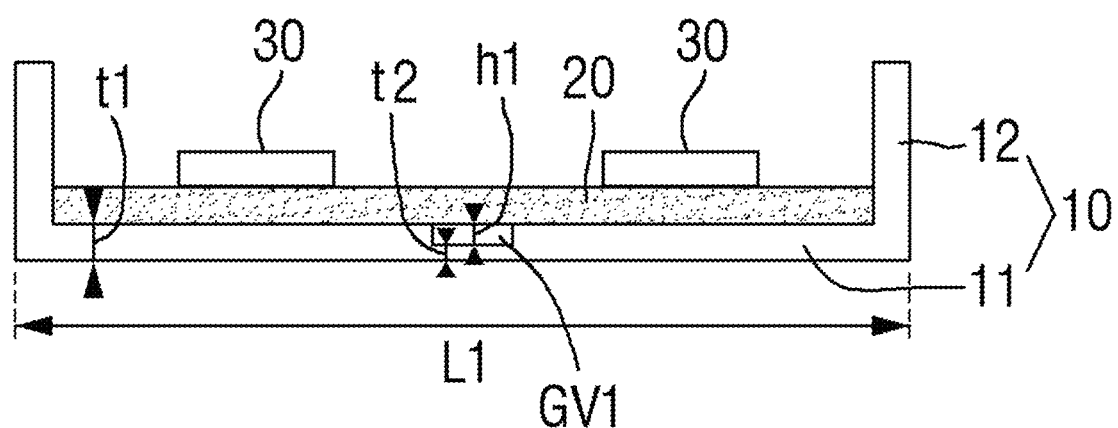
FIG. 4 is a schematic cross-sectional view taken along line III-III' of FIG. 1.
Figure 5:
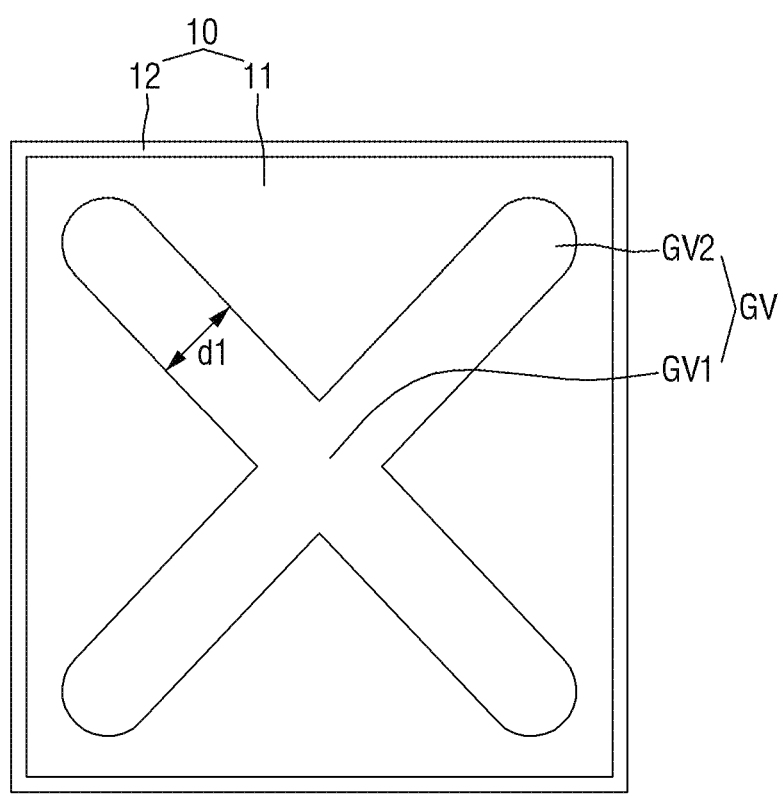
FIG. 5 is a schematic plan view of a base tray according to an embodiment.
Figure 6:
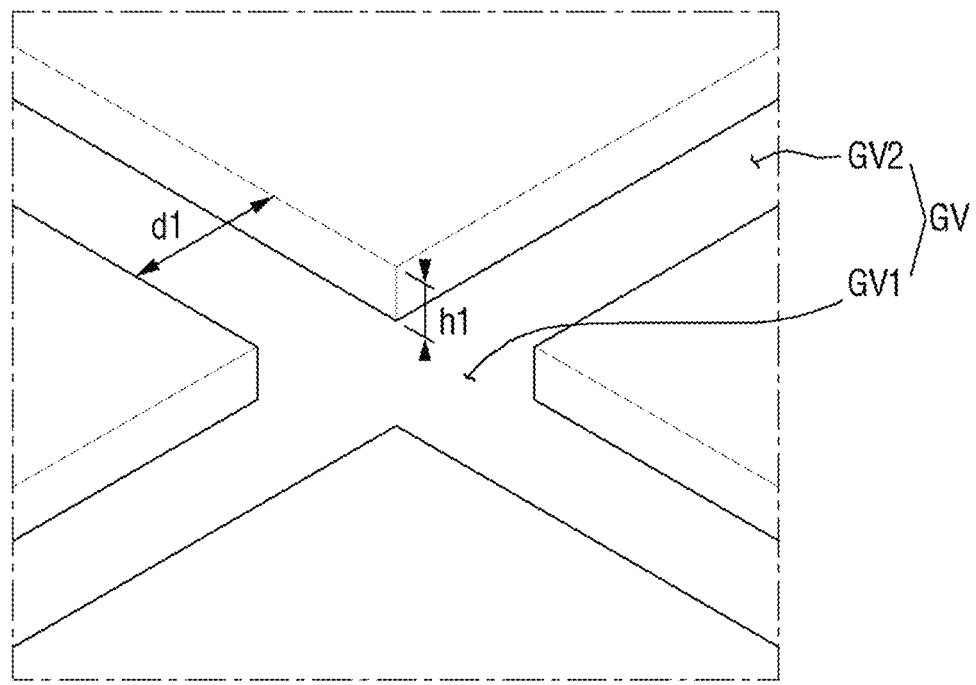
FIG. 6 is a schematic perspective view showing a part of a bottom of a base tray according to an embodiment.

FIG. 1 is a schematic perspective view of a tray assembly according to an embodiment. FIG. 2 is an exploded schematic perspective view of a tray assembly according to an embodiment. FIG. 3 is a schematic cross-sectional view of an anti-slip pad according to an embodiment. FIG. 4 is a schematic cross-sectional view taken along line III-III' of FIG. 1. FIG. 5 is a schematic plan view of a base tray according to an embodiment. FIG. 6 is a schematic perspective view showing a part of a bottom of a base tray according to an embodiment.

Referring to FIGS. 1 to 6, a loading target element 30 may be loaded on a tray assembly 1 according to an embodiment. The loading target element 30 may be, e.g., an electronic element, a display device, or the like. Examples of the display device may include an organic light emitting display device, a micro LED display device, a nano LED display device, a quantum dot light emitting display device, a liquid crystal display device, a plasma display device, a field emission display device, an electrophoretic display device, and an electrowetting display device.

The loading target element 30 may be stored or transferred while being loaded on the tray assembly 1.

The tray assembly 1 according to an embodiment may include a base tray 10, and an anti-slip pad 20 disposed on the base tray 10. In an embodiment, the anti-slip pad 20 may be inserted as a separate component into the base tray 10 and may be separated from the base tray 10. In other words, the anti-slip pad 20 may be detachable from the base tray 10. In another embodiment, the anti-slip pad 20 and the base tray 10 may be integral with each other by extruding the tray assembly 1. Specifically, the anti-slip pad 20 may be formed as a sheet together with the base tray 10 by extrusion and subjected to vacuum molding.

The anti-slip pad 20 according to an embodiment may include a base layer 21, a first non-slip layer 22 disposed on a first surface of the base layer 21, a first antistatic layer 23 disposed on the first non-slip layer 22, and a second non-slip layer 24 disposed on a second surface of the base layer 21. Here, the first antistatic layer 23 may be omitted.

In an embodiment, multiple loading target elements 30 may be positioned on the anti-slip pad 20. The loading target elements 30 may be positioned while being spaced apart from each other by a distance. The anti-slip pad 20 may provide a frictional force to the loading target elements 30 to prevent the movement of the loading target elements 30 even if there is no boundary. Therefore, it may be possible to prevent collision between the loading target elements 30 or collision between the loading target elements 30 and the base tray 10. In another embodiment, one loading target element 30 may be positioned on the anti-slip pad 20. The anti-slip pad 20 may prevent the loading target element 30 from moving and colliding with the base tray 10.

A surface of the anti-slip pad 20 may be entirely flat. Therefore, the loading target element 30 may be stably positioned on any region of the anti-slip pad 20. The anti-slip pad 20 may have the entirely flat surface, and thus may be applied to various sizes of loading target elements 30.

In other words, in case that the loading target element 30 is transferred while being loaded on the tray assembly 1, the anti-slip pad 20 may provide a frictional force to the loading target element 30 to prevent the loading target element 30 from being moved and damaged.

The bottom surface of the anti-slip pad 20 may be partially in contact with the top surface of the base tray 10. As will be described later, a region of a bottom surface portion 11 of the base tray 10 where a groove GV may be formed may not be in contact with the anti-slip pad 20. The edge of the anti-slip pad 20 may be in contact with a sidewall 12 of the base tray 10. However, the disclosure is not limited thereto, and the edge of the anti-slip pad 20 may be separated from the sidewall 12 of the base tray 10.

The anti-slip pad 20 may not be moved on the base tray 10 due to the frictional force provided by the second non-slip layer 24. However, the disclosure is not limited thereto, and an adhesive member (not shown) may be disposed between the anti-slip pad 20 and the base tray 10 to fix the anti-slip pad 20 to the base tray 10.

The anti-slip pad 20 according to an embodiment may be exposed to various environments during a process of transferring of the tray assembly 1. For example, the tray assembly 1 including the anti-slip pad 20 may be exposed to a high temperature. Therefore, it may be desirable that the anti-slip pad 20 exhibits excellent heat resistance.

Further, in case that the anti-slip pad 20 is contaminated, the contamination may be removed by ultrasonic cleaning or the like. Therefore, it may be desirable that the anti-slip pad 20 according to an embodiment exhibits an excellent cleaning performance in ultrasonic cleaning.

The base layer 21 may include thermoplastic polymer resin. For example, the thermoplastic polymer resin may include at least one of polyester (PET A, PET G, PET G-PET A-PET G), styrene butadiene copolymer (SBC), acrylonitrile-butadiene styrene (ABS), polystyrene (PS), polyimide (PI), polyamide, polysulfonate, polycarbonate, polyacrylate, polyvinyl chloride (PVC), polyethylene (PE), polypropylene (PP), modified polyphenylene oxide (M-PPO), a blend or copolymer thereof, phenol resin, epoxy resin, and urethane resin, but is not limited thereto.

The first non-slip layer 22 and the second non-slip layer 24 may include a thermoplastic elastomer. The first non-slip layer 22 and the second non-slip layer 24 may have a friction coefficient of about 0.5 to about 1.5 based on ASTM D1894 that is a testing standard for measuring a friction coefficient. The thermoplastic elastomer may be plastic having excellent flexibility, elasticity, durability, and abrasion resistance. The first non-slip layer 22 and the second non-slip layer 24 may be made of a same material. However, the disclosure is not limited thereto, and the first non-slip layer 22 and the second non-slip layer 24 may be made of different materials.

A thermoplastic elastomer (TPE) may be a polymer material that may be molded like plastic that becomes flexible at a high temperature and exhibits a property of an elastomer at room temperature. The hard portions and the soft portions of the thermoplastic elastomer may be partially changed using a processing method such as injection molding or the like, so that it may be possible to produce various products and it may be easy to design components. The thermoplastic elastomer exhibits elasticity under use conditions and may be molded like thermoplastic under molding conditions.

For example, the thermoplastic elastomer may include at least one of thermoplastic styrenic block copolymer (SBC), thermoplastic olefinic elastomer (TPO), thermoplastic polyurethane (TPU), thermoplastic polyamide (TPAE), or thermoplastic polyester elastomer (TPEE). The thermoplastic olefinic elastomer may include at least one of hard polypropylene (PP), polystyrene (PS), polyethylene (PE), nylon, styrene-acrylonitrile, soft ethylene propylene rubber (EPDM), natural rubber, styrene-butadiene rubber (SBR), ethylene vinyl acetate (EVA) copolymer, and glycol-modified polyethylene terephthalate (PET-G).

The first antistatic layer 23 may include thermosetting resin and an antistatic agent. The antistatic agent may include about 0.1 to about 500 parts by weight with respect to 100 parts by weight of the thermosetting resin.

The thermosetting resin may be any appropriate thermosetting resin. Specifically, the thermosetting resin may be at least one selected from the group of acrylic resin, urethane resin, urethane-acrylic copolymer, ester resin, ether resin, amide resin, epoxy resin, and melamine resin. In case that the thermosetting resin is included at a relatively small amount compared to other components, adhesivity, abrasion resistance, and scratch resistance may deteriorate. In case that the thermosetting resin is excessively included, surface resistance may increase and, thus, an antistatic effect may be reduced.

The antistatic agent may be a conductive polymer such as polyaniline, polypyrrole, polythiophene, poly(3,4-ethylenethiophene), derivatives thereof, copolymers thereof, π-conjugated electrically conductive polymer, inherently dissipative polymer (IDP), carbon nanotube, graphene, or a combination thereof.

The first antistatic layer 23 may further include at least one additive selected among a dispersant, a slip agent, a flow improver, a crosslinking agent, and a conductive polymer. The additive may be included at a ratio of about 0.1 to about 100 parts by weight with respect to 100 parts by weight of the thermosetting resin.

The dispersant may be, e.g., any one selected among a high molecular weight anionic surfactant, low molecular weight unsaturated carboxylic acid, a polysiloxane copolymer, unsaturated polyamine amide salt, polyethylene glycol, and ethyl cellosolve, or a mixture thereof.

Silicone-based materials may be used as the slip agent. For example, any one selected from a polyether siloxane copolymer and a modified polysiloxane, or a mixture thereof may be used.

As the flow improver, for example, any one selected from the group of glycerin, propylene glycol, sorbitol, tricresyl phosphate ester, triphenyl phosphate, and gel type silica, or a mixture thereof may be used.

As the crosslinking agent, for example, any one selected from the group of melamine-based, carbodiimide-based, oxazolidine-based, epoxy-based, isocyanate-based and aziridine-based crosslinking agents, or a mixture thereof may be used.

The first antistatic layer 23 may be coated on the first non-slip layer 22 in the form of an antistatic coating solution. Specifically, the antistatic coating solution may be coated on the first non-slip layer 22 and dried to form the antistatic layer 23. The formation of the first antistatic layer 23 using the antistatic coating solution will be described later.

The base tray 10 may include a bottom surface portion 11 and a sidewall 12 disposed adjacent to (e.g., to surround) the bottom surface portion 11. The anti-slip pad 20 may be positioned in the space defined by the top surface of the bottom surface portion 11 and the inner surface of the sidewall 12 of the base tray 10.

The base tray 10 may have a rectangular shape in plan view. The base tray 10 may include a long side LS having a first length L1 and a short side SS having a second length L2.

The central portion of the base tray 10 may be deflected due to its own weight. The degree of deflection of the base tray 10 may vary depending on the material of the base tray 10 or the shape of the bottom surface portion 11. As the deflection of the base tray 10 may be reduced, the loading target element 30 may be more stably loaded. A pattern may be formed at the bottom surface portion 11 of the base tray 10 to minimize the deflection of the base tray 10.

In an embodiment, the bottom surface portion 11 of the base tray 10 may have a pattern including a groove GV (e.g., having a shape of a groove GV). The groove GV may include a central portion GV1 and branch portions GV2 extending from the central portion GV1 toward four corners of the base tray 10 having a rectangular shape in plan view. The branch portions GV2 of the groove GV may extend with a constant first width d1. However, the disclosure is not limited thereto, and the branch portions GV2 may have different widths for each region. For example, the width of the branch portion GV2 may be increased or decreased as the distance from the central portion GV1 increases. The groove GV may have a constant first depth h1. However, the disclosure is not limited thereto, and the groove GV may have different depths for each region. For example, the depth of the groove GV may be increased or decreased as the distance from the central portion GV1 increases.

In an embodiment, the bottom surface portion 11 of the base tray 10 may have a first thickness t1 in a region where the groove GV may not be disposed and a second thickness t2 in a region where the groove GV may be disposed. The first thickness t1 may be substantially the same as the sum of the second thickness t2 and the first depth h1.

For example, the base tray 10 having a rectangular shape with a horizontal and vertical length of about 400 mm to about 600 mm may have a deflection amount of less than about 1 mm due to the pattern having the shape of the groove GV.

The base tray 10 may, but not necessarily, include at least one of acrylonitrile-butadiene styrene (ABS), polyethylene terephthalate (PET), polycarbonate (PC), polypropylene (PP), or polyolefin resin. The base tray 10 may further include, in addition to the selected at least one material, at least one of high density polyethylene (HDPE) or thermoplastic polyolefin (TPO).

Figure 7:
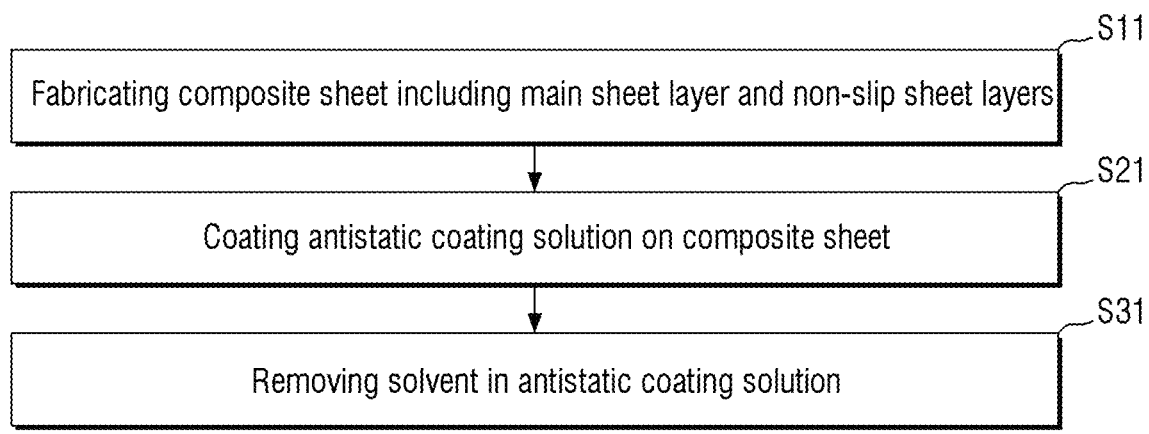
FIG. 7 is a flowchart showing a method of fabricating an anti-slip pad according to an embodiment.

FIG. 7 is a flowchart showing a method of fabricating an anti-slip pad according to an embodiment.

Referring to FIGS. 6 and 7, the method of fabricating the anti-slip pad 20 according to an embodiment may include a step S11 of fabricating a composite sheet layer including the base layer 21, the first non-slip layer 22, and the second non-slip layer 24, a step S21 of coating an antistatic coating solution on the composite sheet layer, and a step S31 of thermosetting the antistatic coating solution.

The step S11 of fabricating the composite sheet layer may include a step of extruding a thermoplastic polymer sheet and thermoplastic elastomers (TPE) disposed on a first surface and a second surface of the thermoplastic polymer sheet using an extruder. Accordingly, the composite sheet layer including the base layer 21 and the first and second non-slip layers 22 and 24 disposed on a first side and a second side of the base layer 21, respectively, may be fabricated. The step of performing extrusion using the extruder may be performed at a temperature of about 100° C. to about 300° C., and the composite sheet layer may be extruded into a sheet having a thickness of about 0.1 mm to about 4.0 mm.

The thermoplastic polymer sheet for forming the base layer 21 may include at least one thermoplastic polymer resin selected among acrylonitrile-butadiene styrene (ABS), polyethylene terephthalate (PET), and polystyrene (PS).

The first and second non-slip layers 22 and 24 respectively disposed on the first side and the second side of the base layer 21 may have a friction coefficient of about 0.5 to about 15 based on ASTM D1894.

After the step S11 of fabricating the composite sheet layer, the step S21 of coating an antistatic coating solution on the composite sheet layer may be performed. The antistatic coating solution may be coated by various coating methods. For example, the antistatic coating solution may be coated on the composite sheet layer by at least one of the methods among gravure, micro gravure coating, comma coating, roll coating, bar coating, dip coating, flow coating, spray coating, and slot die, but the coating method is not limited thereto.

The antistatic coating solution may include thermosetting resin, an antistatic agent, and water or an organic solvent. The antistatic coating solution may further include at least one additive selected among a dispersant, a slip agent, a flow improver, a crosslinking agent, and a conductive polymer.

The antistatic agent in the antistatic coating solution may be included at a ratio of about 0.1 to about 500 parts by weight with respect to 100 parts by weight of the thermosetting resin. If the amount of the antistatic agent is less than about 0.1 parts by weight, surface resistance may be increased and, thus, the antistatic effect may be reduced. If the amount of the antistatic agent exceeds about 500 parts by weight, physical properties such as transmittance, abrasion resistance, scratch resistance, and the like may deteriorate.

The water or the organic solvent in the antistatic coating solution may be included at a ratio of about 10 to about 2000 parts by weight with respect to 100 parts by weight of the thermosetting resin. In case that the water or the organic solvent is included at a ratio of about 10 to about 2000 parts by weight, the thermosetting resin, the antistatic agent, the additive and the like may be uniformly dissolved and other physical properties may not be affected.

The additive in the antistatic coating solution may be included at a ratio of about 0.1 to about 100 parts by weight with respect to 100 parts by weight of the thermosetting resin.

Among the materials included in the antistatic coating solution, the additive such as the thermosetting resin, the antistatic agent, the dispersant, the slip agent, the flow improver, the crosslinking agent, the conductive polymer, and the like has been described. Therefore, the description thereof will be omitted in the following.

The organic solvent is not limited as long as it may dissolve and disperse the thermosetting resin, the antistatic agent, the additive and the like. For example, as the organic solvent, any one selected from the group of dimethyl sulfoxide (DMSO), dimethylformamide (DMF), N-methyl-2-pyrrolidinone (NMP), ethylene glycol, propylene glycol methyl ether, 2-butanone, 4-methyl-2-pentanone, ethyl cellosolve, methyl cellosolve, methyl alcohol, ethyl alcohol, isopropyl alcohol, isobutyl alcohol, t-butyl alcohol, benzyl alcohol, di-acetone alcohol, methyl ethyl ketone (MEK), methyl isobutyl ketone (MIBK), and propyl cellosolve, or a mixture thereof may be used. Further, the organic solvent may be used while being mixed with water.

After the step S21 of coating the antistatic coating solution on the composite sheet layer, the step S31 of thermosetting the antistatic coating solution may be performed. The step S31 of thermosetting the antistatic coating solution may include a step of completely removing water and a solvent such as an organic solvent or the like in the antistatic coating solution by applying heat at a temperature of about 40° C. to about 150° C. for about 1 to about 10 minutes.

The tray assembly 1 according to an embodiment may include the anti-slip pad 20 having a high friction coefficient with respect to the loading target element 30, so that it may be possible to stably load the loading target element 30. Further, the deflection of the tray assembly 1 may be minimized due to the pattern (e.g., the groove GV) formed on the base tray 10.

Hereinafter, other embodiments of the tray assembly 1 will be described. In the following embodiments, a description of the same components as those of the above-described embodiment will be omitted or simplified, and differences will be described.

Figure 8:
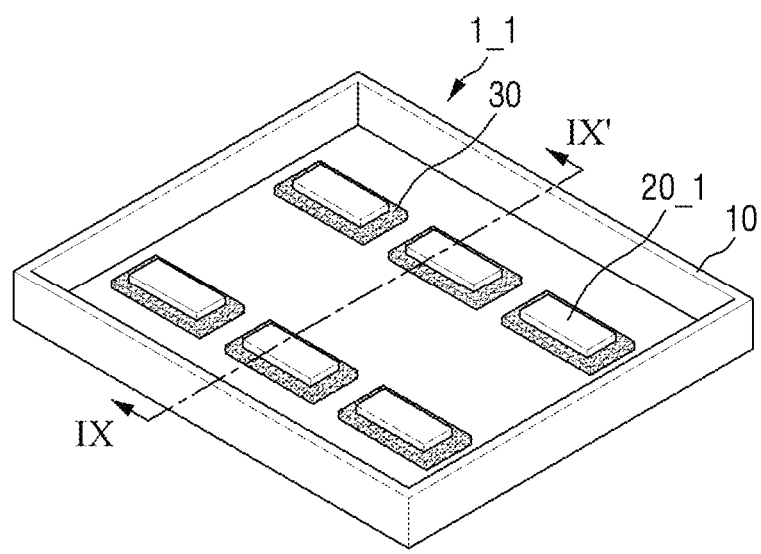
FIG. 8 is a schematic perspective view showing a tray assembly according to another embodiment.
Figure 9:
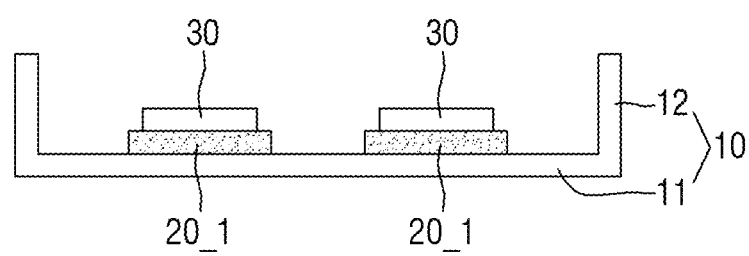
FIG. 9 is a schematic cross-sectional view taken along line IX-IX' of FIG. 8.

FIG. 8 is a schematic perspective view showing a tray assembly according to another embodiment. FIG. 9 is a schematic cross-sectional view taken along line IX-IX' of FIG. 8.

Referring to FIGS. 8 and 9, a tray assembly 1_1 according to an embodiment may be different from the tray assembly 1 according to an embodiment in that it may include an anti-slip pad 20_1 disposed only in a region where the loading target element 30 may be loaded. The tray assembly 1_1 according to an embodiment may include multiple divided anti-slip pads 20_1. Although FIG. 8 illustrates six anti-slip pads 20_1 arranged in three rows and two columns, the number and the arrangement of the anti-slip pads 20_1 are not limited thereto.

The area of each anti-slip pad 20_1 may be, but is not necessarily, greater than the area of the loading target element loaded on the anti-slip pad 20_1. The anti-slip pads 20_1 may have the same area. However, the disclosure is not limited thereto and the anti-slip pads 20_1 may have different areas.

The tray assembly 1_1 according to an embodiment includes the anti-slip non slip pad 20_1 having a high friction coefficient with respect to the loading target element 30, so that it may be possible to stably load the loading target element 30. Further, the deflection of the tray assembly 1_1 may be minimized due to the pattern formed on the base tray 10.

Further, in the tray assembly 1_1 according to an embodiment, the anti-slip pads 20_1 may be disposed only in a region where the loading target elements 30 may be disposed, so that it may be possible to prevent the loading target elements 30 from slipping by a small number of anti-slip pads 20_1.

Figure 10:
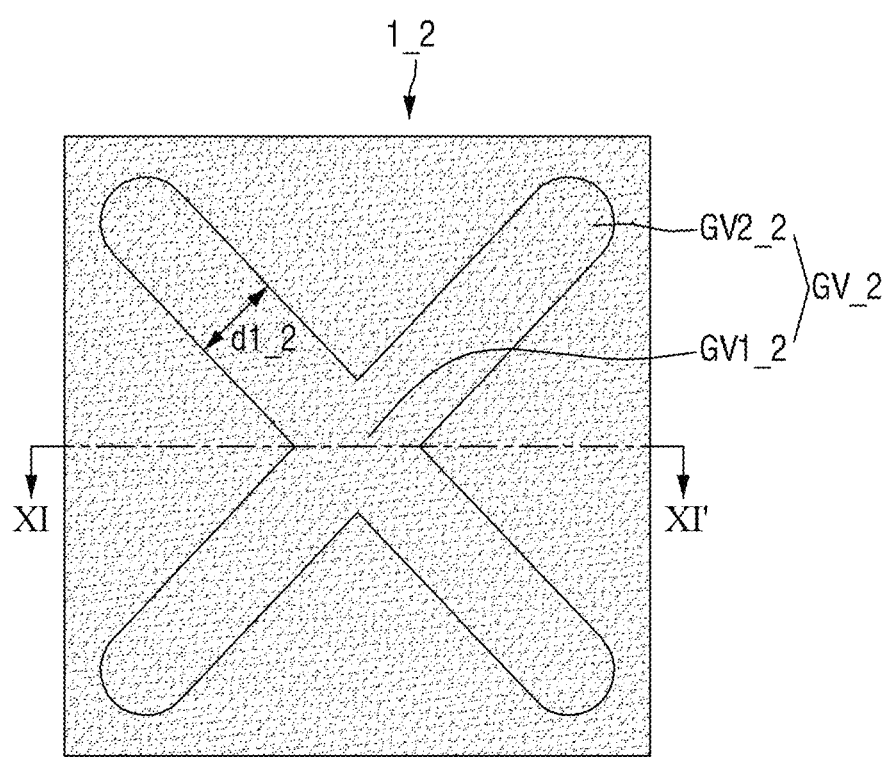
FIG. 10 is a schematic plan view of a tray assembly according to still another embodiment.
Figure 11:
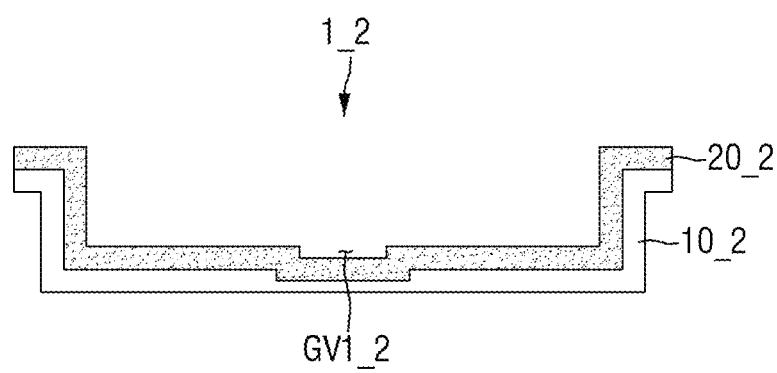
FIG. 11 is a schematic cross-sectional view taken along line XI-XI' of FIG. 10.

FIG. 10 is a schematic plan view of a tray assembly according to still another embodiment. FIG. 11 is a schematic cross-sectional view taken along line XI-XI' of FIG. 10.

Referring to FIGS. 10 and 11, a tray assembly 1_2 according to an embodiment may have the same pattern as the pattern formed at the base tray 10 according to an embodiment. In other words, in the tray assembly 1_2 according to an embodiment, not only a base tray 10_2 but also an anti-slip pad 20_2 may have a pattern. In the following, the case in which the tray assembly 1_2 according to an embodiment has the same pattern as the pattern of the base tray 10 according to an embodiment shown in FIG. 5 will be described. However, the disclosure is not limited thereto, and the tray assembly 1_2 may have the same pattern as the patterns shown in FIGS. 13 to 17.

The tray assembly 1_2 according to an embodiment may have a groove GV_2. The groove GV_2 may have a central portion GV1_2 and branch portions GV2_2 extending from the central portion GV1_2 toward the corners of the base tray 10_2. The branch portion GV2_2 of the groove GV_2 may extend with a first width d1_2. In an embodiment, the groove GV_2 may have substantially the same shape as that of the groove GV of the base tray 10 according to an embodiment described with reference to FIGS. 5 and 6.

In the tray assembly 1_2 according to an embodiment, the anti-slip pad 20_2 may be disposed to cover a sidewall 12_2. The edges of the anti-slip pad 20_2 may be disposed on the sidewall 12_2. The tray assembly 1_2 according to an embodiment may be fabricated by a step of bonding and injecting a sheet forming the base tray 10_2 and a sheet forming the anti-slip pad 20_2.

The tray assembly 1_2 according to an embodiment may include the anti-slip non slip pad 20_2 having a high friction coefficient with respect to the loading target element 30, so that it may be possible to stably load the loading target element 30.

Further, it may be possible to more effectively minimize the deflection of the tray assembly 1_2 according to an embodiment by forming the patterns at both the base tray 10_2 and the anti-slip pad 20_2.

Figure 12:
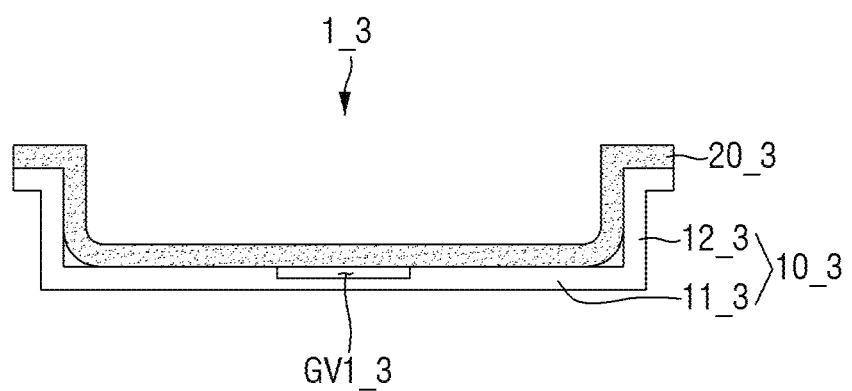
FIG. 12 is a schematic cross-sectional view of a tray assembly according to still another embodiment.

FIG. 12 is a schematic cross-sectional view of a tray assembly according to still another embodiment.

Referring to FIG. 12, in a tray assembly 1_3 according to an embodiment, an anti-slip pad 20_3 may be disposed to cover a sidewall 12_3. The edges of the anti-slip pad 20_3 may be disposed on the sidewall 12_3.

A separation space may be formed between the anti-slip pad 20_3 and the edges of a bottom surface portion 11_3. The tray assembly 1_3 according to an embodiment may be fabricated by fabricating a base tray 10_3 and positioning an anti-slip pad 20_3 on the base tray 10_3. In the tray assembly 1_3 according to an embodiment, the anti-slip pad 20_3 may be disposed to cover the sidewall 12_3 of the base tray 10_3, so that the contact area therebetween may be increased and the anti-slip pad 20_3 may be more stably fixed to the base tray 10_3.

Figure 13:
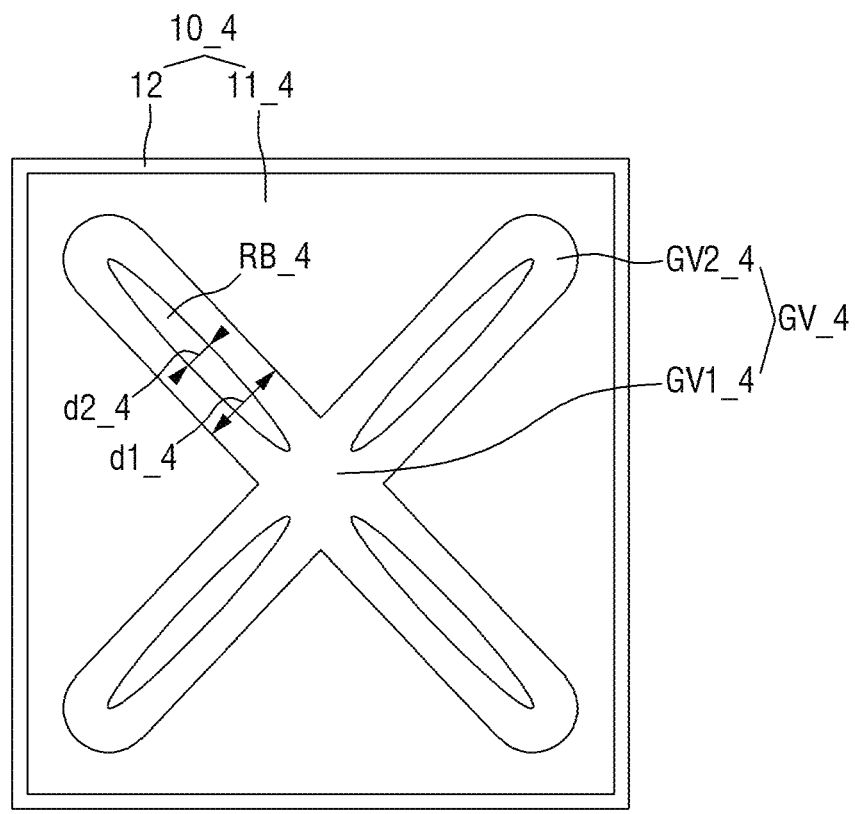
FIG. 13 is a schematic plan view of a base tray according to another embodiment.

FIG. 13 is a schematic plan view of a base tray according to another embodiment.

Referring to FIG. 13, a bottom surface portion 11_4 of a base tray 10_4 according to an embodiment may have a pattern whose shape may be different from that of the pattern of the bottom surface portion 11 of the base tray 10 according to an embodiment. The pattern included in the base tray 10_4 according to an embodiment may include a groove GV_4 and ribs RB_4 disposed in the groove GV_4. The groove GV_4 may have a central portion GV1_4 and branch portions GV2_4 extending from the central portion GV1_4 toward the corners of the base tray 10_4. The branch portion GV2_4 of the groove GV_4 may extend with a first width d1_4. In an embodiment, the groove GV_4 may have substantially the same shape as that of the groove GV of the base tray 10 according to an embodiment described with reference to FIGS. 5 and 6. The rib RB_4 that may be an island structure may be disposed in the branch portion GV2_4 of the groove GV_4. The rib RB_4 may have a second width d2_4 that may be a maximum width in a width direction of the branch portion GV2_4.

A tray assembly 1_4 including the base tray 10_4 according to an embodiment may include an anti-slip pad 20 having a high friction coefficient with respect to the loading target element 30, so that the loading target element 30 may be stably loaded. Further, the deflection of the tray assembly 1_4 may be minimized due to the pattern formed on the base tray 10_4.

Further, the base tray 10_4 may further include the ribs RB_4 compared to the base tray 10 according to another embodiment, so that it may be possible to increase the contact area with the anti-slip pad 20 positioned therein and improve the fixing force between the anti-slip pad 20 and the base tray 10_4.

Figure 14:
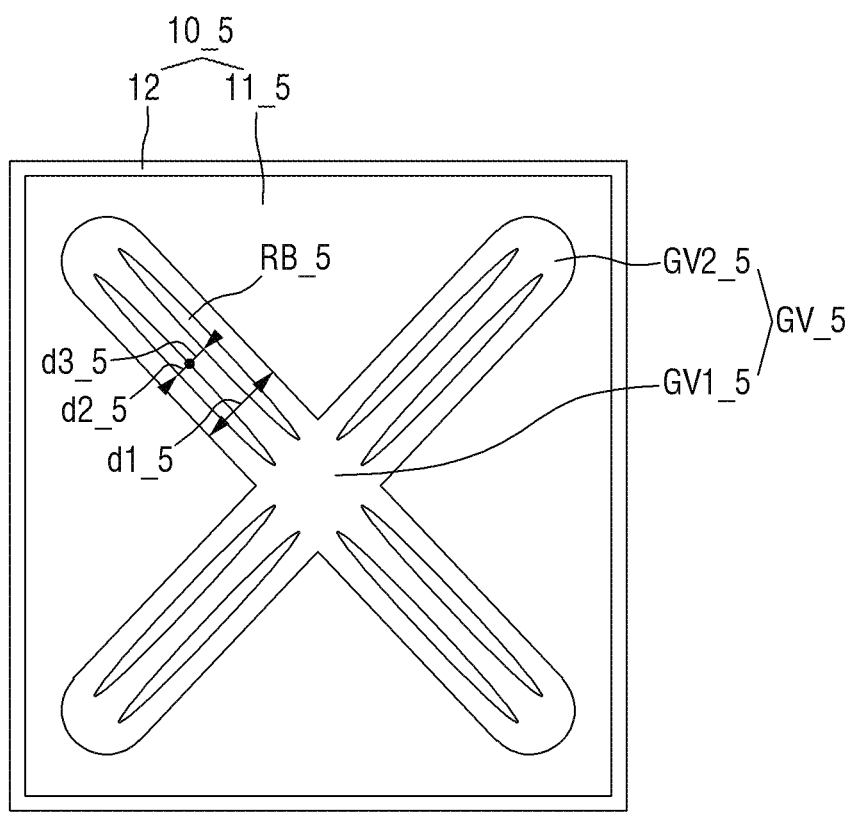
FIG. 14 is a schematic plan view of a base tray according to still another embodiment.

FIG. 14 is a schematic plan view of a base tray according to still another embodiment.

Referring to FIG. 14, a bottom surface portion 11_5 of a base tray 10_5 according to an embodiment may have a pattern whose shape may be different from that of the pattern of the bottom surface portion 11 of the base tray 10 according to another embodiment. The pattern included in the base tray 10_5 according to an embodiment may include an X-shaped groove GV_5 in plan view and multiple ribs disposed in the groove GV_5. The groove GV_5 may have a central portion GV1_5 and branch portions GV2_5 extending form the central portion GV1_5 toward the corners of the base tray 10_5. The branch portion GV2_5 of the groove GV_5 may extend with a first width d1_5. In an embodiment, the groove GV_5 may have substantially the same shape as that of the groove GV of the base tray 10 according to an embodiment described with reference to FIGS. 5 and 6. The rib RB_5 that may be an island structure may be disposed in the branch portion GV2_5 of the groove GV_5. The rib RB_5 may have a second width d2_5 that may be a maximum width in a width direction of the branch portion GV2_5. The top surface of the rib RB_5 and the top surface of the bottom surface portion 11_5 may be disposed on a same plane.

A tray assembly 1_5 including the base tray 10_5 according to an embodiment may include an anti-slip pad 20 having a high friction coefficient with respect to the loading target element 30, so that the loading target element 30 may be stably loaded. Further, the deflection of the tray assembly 1_5 may be minimized due to the pattern formed on the base tray 10_5.

Further, the base tray 10_5 according to an embodiment may further include the ribs RB_5, so that it may be possible to increase the contact area with the anti-slip pad 20 positioned therein and improve the fixing force between the anti-slip pad 20 and the base tray 10_5.

Figure 15:
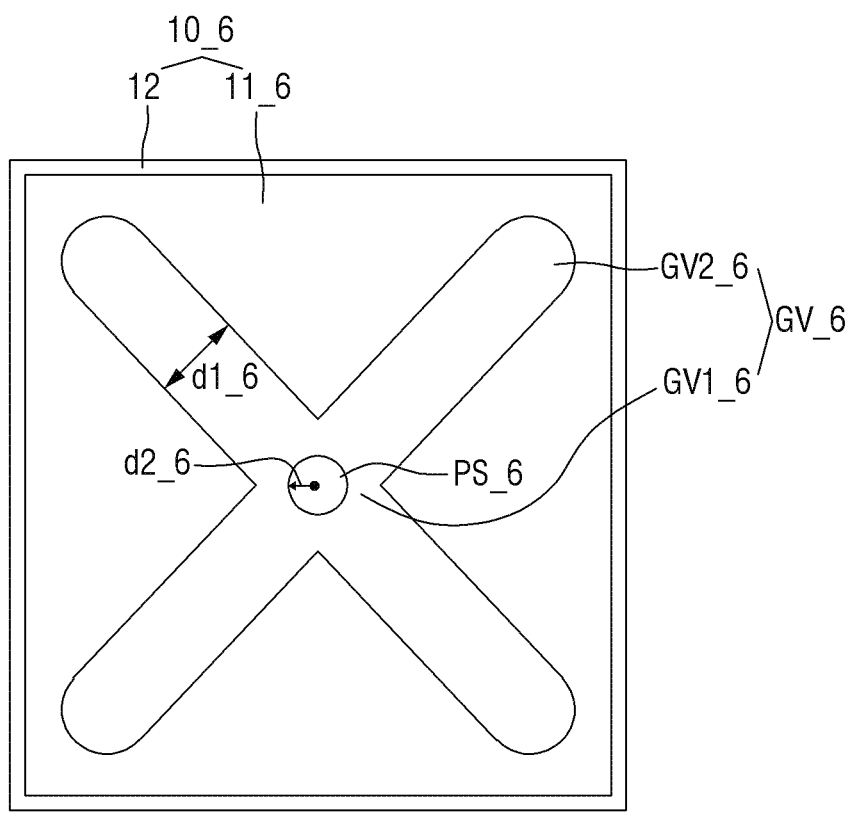
FIG. 15 is a schematic plan view of a base tray according to still another embodiment.

FIG. 15 is a schematic plan view of a base tray according to still another embodiment.

Referring to FIG. 15, a bottom surface portion 11_6 of a base tray 10_6 according to an embodiment may have a pattern whose shape may be different from that of the pattern of the bottom surface portion 11 of the base tray 10 according to another embodiment. The pattern included in the base tray 10_6 according to an embodiment may include an X-shaped groove GV_6 in plan view and a post PS_6 disposed in the groove GV_6. The groove GV_6 may have a central portion GV1_6 and branch portions GV2_6 extending from the central portion GV1_6 toward the corners of the base tray 10_6. The branch portion GV2_6 of the groove GV_6 may extend with a first width d1_6. In this embodiment, the groove GV_6 may have substantially the same shape as that of the groove GV of the base tray 10 according to an embodiment described with reference to FIGS. 5 and 6. The post PS_6 that may be an island structure may be disposed in the central portion GV1_6 of the groove GV_6. The post PS_6 may have a cylindrical shape and may have a radius corresponding to a second width d2_6. The top surface of the post PS_6 and the top surface of the bottom surface portion 11_6 may be disposed on a same plane.

A tray assembly 1_6 including the base tray 10_6 according to an embodiment includes an anti-slip pad 20 having a high friction coefficient with respect to the loading target element 30, so that the loading target element 30 may be stably loaded. Further, the deflection of the tray assembly 1_6 may be minimized due to the pattern formed on the base tray 10_6.

Further, the base tray 10_6 according to an embodiment may further include the post PS_6, so that it may be possible to increase the contact area with the anti-slip pad 20 positioned therein and improve the fixing force between the anti-slip pad 20 and the base tray 10_6. Further, the durability of the base tray 10_6 may be improved by securing a sufficient thickness at the central region of the base tray 10_6 due to the post PS_6.

Figure 16:
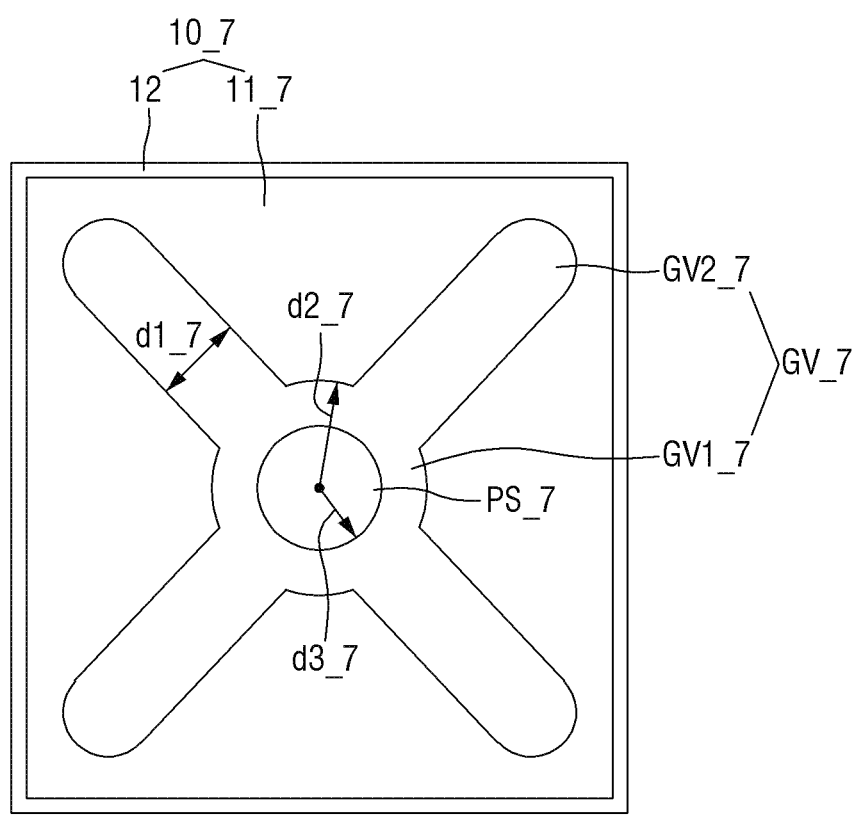
FIG. 16 is a schematic plan view of a base tray according to still another embodiment.

FIG. 16 is a schematic plan view of a base tray according to still another embodiment.

Referring to FIG. 16, a bottom surface portion 11_7 of a base tray 10_7 according to an embodiment may have a pattern whose shape may be different from that of the bottom surface portion 11 of the base tray 10 according to another embodiment. The pattern included in the base tray 10_7 according to an embodiment may include a groove GV_7 and a post PS_7 disposed in the groove GV_7. The groove GV_7 may have a central portion GV1_7 and branch portions GV2_7 extending from the central portion GV1_7 toward the corners of the base tray 10_7. The branch portion GV2_7 may extend with a first width d1_7. The central portion GV1_7 may have a circular shape in plan view. The central portion GV1_7 may have a radius corresponding to a second width d2_7.

The post PS_7 that may be an island structure may be disposed in the central portion GV1_7 of the groove GV_7. The post PS_7 may have a cylindrical shape and may have a radius corresponding to a third width d3_7. The top surface of the post PS_7 and the top surface of the bottom surface portion 11_7 may be disposed on a same plane.

A tray assembly 1_7 including the base tray 10_7 according to an embodiment may include an anti-slip pad 20 having a high friction coefficient with respect to the loading target element 30, so that the loading target element 30 may be stably loaded. Further, the deflection of the tray assembly 1_7 may be minimized due to the pattern formed on the base tray 10_7.

Further, the base tray 10_7 according to an embodiment may further include the post PS_7, so that it may be possible to increase the contact area with the anti-slip pad 20 positioned therein and improve the fixing force between the anti-slip pad 20 and the base tray 10_7. Further, the durability of the base tray 10_7 may be improved by securing a sufficient thickness at the central region of the base tray 10_7 due to the post PS_7.

Figure 17:
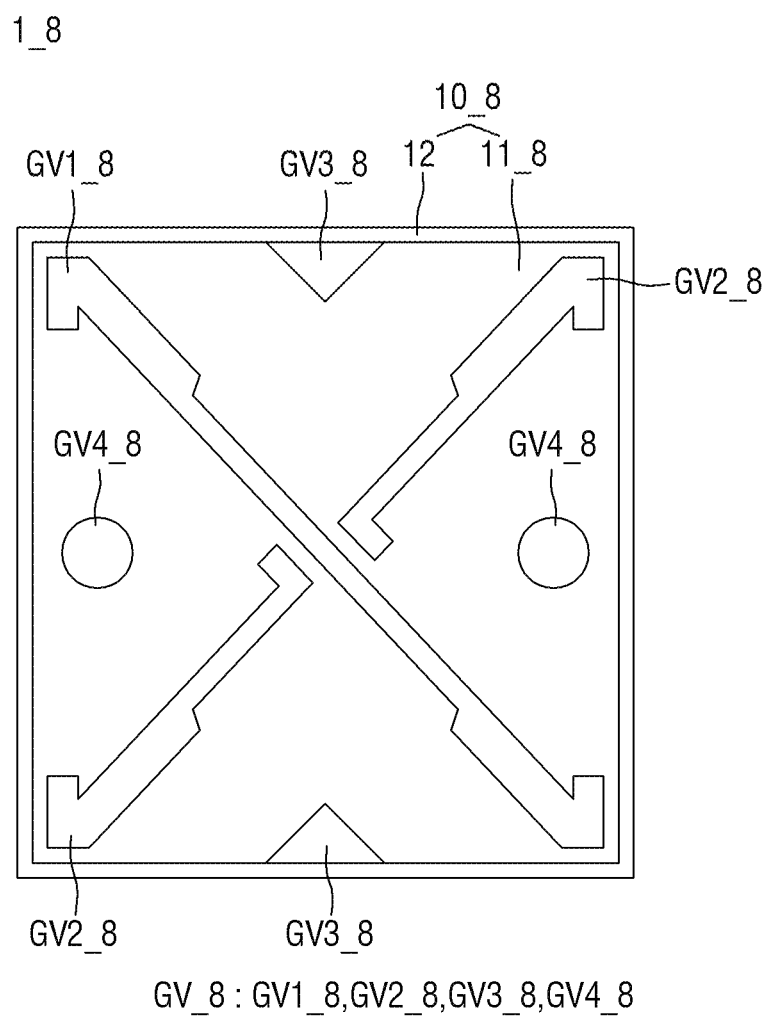
FIG. 17 is a schematic plan view of a base tray according to still another embodiment.

FIG. 17 is a schematic plan view of a base tray according to still another embodiment.

Referring to FIG. 17, a bottom surface portion 11_8 of a base tray 10_8 according to an embodiment may have a pattern whose shape may be different from that of the bottom surface portion 11 of the base tray 10 according to another embodiment. The pattern included in the base tray 10_8 according to an embodiment may include multiple grooves GV_8. The grooves GV_8 may include a first bar groove GV1_8, second bar grooves GV2_8, triangular grooves GV3_8, and circular grooves GV4_8. In an embodiment, the first bar groove GV1_8 may have a shape extending from an upper left side toward a lower right side in plan view in FIG. 17. The second bar grooves GV2_8 may have a shape extending from an upper right side toward a lower left side in plan view in FIG. 17. The second bar grooves GV2_8 may be spaced apart from each other with the first bar groove GV1_8 interposed therebetween. The triangular grooves GV3_8 may be disposed near the upper side and the lower side of the sidewall 12 in FIG. 17. The triangular groove GV3_8 may have a triangular shape in plan view. For example, the triangular groove GV3_8 disposed near the upper side of the sidewall 12 may have a right-angled triangular shape whose hypotenuse may be in contact with the upper side of the sidewall 12 in plan view. The triangular groove GV3_8 disposed near the lower side of the sidewall 12 may have a right-angled triangular shape whose hypotenuse may be in contact with the lower side of the sidewall 12 in plan view. The circular grooves GV4_8 may be disposed near the left side and the right side of the sidewall 12 in FIG. 17. The circular groove GV4_8 may have a circular shape in plan view.

A tray assembly 1_8 including the base tray 10_8 according to an embodiment may include an anti-slip pad 20 having a high friction coefficient with respect to the loading target element 30, so that the loading target element 30 may be stably loaded. Further, the deflection of the tray assembly 1_8 may be minimized due to the pattern formed on the base tray 10_8.

Further, the base tray 10_8 according to an embodiment has a sufficient thickness due to the first bar groove GV1_8, the second bar grooves GV2_8, the triangular grooves GV3_8, and the circular grooves GV4_8. Accordingly, it may be possible to improve the durability of the base tray 10_8 and stably support the loading target element 30 positioned thereon.

Figure 18:
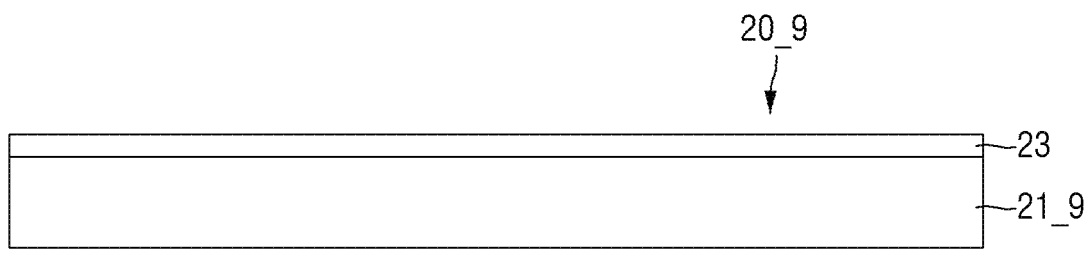
FIG. 18 is a schematic cross-sectional view of an anti-slip pad according to another embodiment.

FIG. 18 is a schematic cross-sectional view of an anti-slip pad according to another embodiment.

Referring to FIG. 18, a base layer 21_9 of an anti-slip pad 20_9 according to an embodiment may be different from the base layer 21 of the anti-slip pad 20 according to another embodiment in that it may further include a thermoplastic elastomer (TPE).

The base layer 21_9 according to an embodiment may be fabricated by mixing and extruding a thermoplastic polymer resin and a thermoplastic elastomer (TPE) using an extruder. The step of performing extrusion using the extruder may be performed at a temperature of about 100° C. to about 300° C., and the composite sheet layer may be extruded into a sheet having a thickness of about 0.1 mm to about 4.0 mm.

The base layer 21_9 according to an embodiment may include the thermoplastic elastomer (TPE) and thus may have a friction coefficient of about 0.5 to about 10 based on ASTM D1894.

The anti-slip pad 20_9 according to an embodiment may include the base layer 21_9 including the thermoplastic elastomer (TPE), and thus may be fabricated by a simple process. Specifically, the anti-slip pad 20_9 may be fabricated by forming the base layer 21_9 by mixing and extruding the thermoplastic polymer resin and the thermoplastic elastomer (TPE), and forming the first antistatic layer 23 on one surface of the base layer 21_9.

Figure 19:
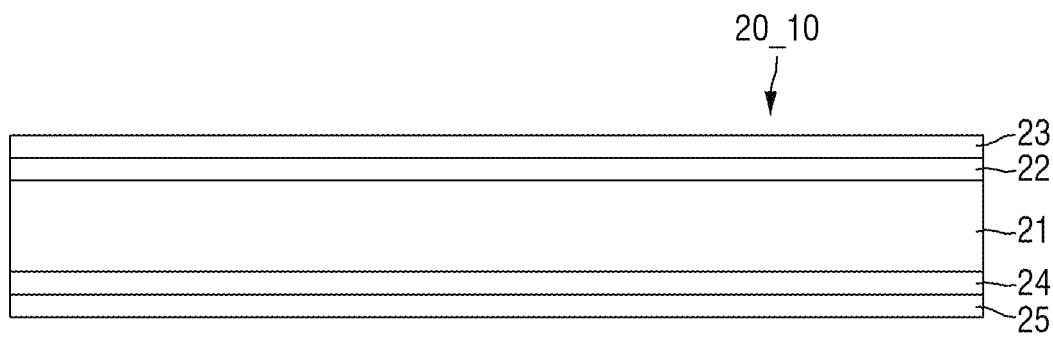
FIG. 19 is a schematic cross-sectional view of an anti-slip pad according to still another embodiment.

FIG. 19 is a schematic cross-sectional view of an anti-slip pad according to still another embodiment.

Referring to FIG. 19, an anti-slip pad 20_10 according to an embodiment may be different from the anti-slip pad 20 according to another embodiment in that it may further include a second antistatic layer 25 disposed on the second non-slip layer 24.

The anti-slip pad 20_10 according to an embodiment may have a friction coefficient of about 0.5 to about 15 based on ASTM D1894.

The anti-slip pad 20_10 according to an embodiment may have a symmetrical structure due to the second antistatic layer 25, which may be advantageous in that it may not be necessary to distinguish a surface to be positioned on the base tray 10. Further, since the anti-slip pad 20_10 according to an embodiment may further include the second antistatic layer 25, the surface resistance may be increased and, thus, the antistatic effect may be improved. Accordingly, it may be possible to effectively prevent damage that may occur at the loading target element 30.

Hereinafter, the disclosure will be described in more detail using fabrication examples and test examples.

FABRICATION EXAMPLES 1 TO 5: FABRICATION OF UNSTRETCHED ANTI-SLIP PAD

Fabrication Example 1

A TPU/PS/TPU mixed sheet was fabricated by co-extruding TPU resin, PS resin, and TPU resin together with a gloss roll and a cooling roll through a T-die. Further, an antistatic coating solution including about 3 parts by weight of carbon nanotube, about 10 parts by weight of acrylic copolymer binder, about 50 parts by weight of isopropyl alcohol, about 36 parts by weight of water, and about 1 part by weight of a flow additive was prepared.

One surface of the mixed sheet was coated with the antistatic solution with a thickness of about 0.3 μm (coating after drying) by a gravure coating method, and then subjected to thermosetting at about 60° C. to about 80° C. to form a first antistatic layer. The other surface of the mixed sheet was coated with the antistatic solution and subjected to thermosetting in the same manner to form a second antistatic layer. Accordingly, an unstretched anti-slip pad having the antistatic layers on both surfaces thereof was fabricated.

Fabrication Example 2

An unstretched anti-slip pad was fabricated in the same manner as in Fabrication Example 1 except that polyethylene dioxythiophene/polystyrene sulfonic acid (PEDOT/PSS) as a conductive polymer was used instead of the carbon nanotube used in Fabrication Example 1.

Fabrication Example 3

An unstretched anti-slip pad was fabricated in the same manner as in Fabrication Example 1 except that an IDP ion-type polymer was used instead of the carbon nanotube used in Fabrication Example 1.

Fabrication Example 4

An unstretched anti-slip pad was fabricated in the same manner as in Fabrication Example 1 except that TPO resin (i.e., TPO/PS/TPO) resin was used instead of TPU resin used in Fabrication Example 1 at the time of co-extrusion.

Fabrication Example 5

A mixed sheet having the first antistatic layer 23 and the second antistatic layer 25 formed using a PS single layer sheet formed using PS resin instead of TPU resin and PS resin used in Fabrication Example 1 at the time of co-extrusion was fabricated.

<Test Example 1> Measurement of Surface Resistance and Friction Coefficient of Unstretched Anti-Slip Pad The surface resistance of the unstretched anti-slip pad according to Fabrication Examples 1 to 5 was measured using ASTM D257. Further, a reference static friction coefficient and a kinetic friction coefficient were measured using ASTM D1894. The results are shown in Table 1 below.

TABLE 1

| | | Fabrication Example 1 | Fabrication Example 2 | Fabrication Example 3 | Fabrication Example 4 | Fabrication Example 5 |
|---|---|---|---|---|---|---|
| Surface resistance ($\Omega/cm^2$) | | $10^6$ | $10^6$ | $10^6$ | $10^6$ | $10^6$ |
| Friction coefficient | Static friction coefficient | 10.25 | 10.11 | 15.11 | 19.34 | 0.46 |
| | Kinetic friction coefficient | 10.15 | 10.95 | 15.95 | 20.27 | 0.39 |

FABRICATION EXAMPLES 6-9: FABRICATION OF TRAY ASSEMBLY

Fabrication Example 6

A tray assembly including an anti-slip pad stretched by about five times (thickness was reduced to about ⅕ of its initial value) was fabricated by vacuum-molding the unstretched anti-slip pad fabricated in Fabrication Example 1 at a temperature of about 150° C. to about 180° C.

Fabrication Example 7

A tray assembly was fabricated in the same manner as in Fabrication Example 6 except that the unstretched anti-slip pad fabricated in Fabrication Example 2 was used.

Fabrication Example 8

A tray assembly was fabricated in the same manner as in Fabrication Example 6 except that the unstretched anti-slip pad fabricated in Fabrication Example 3 was used.

Fabrication Example 9

A tray assembly was fabricated in the same manner as in Fabrication Example 6 except that the unstretched anti-slip pad fabricated in Fabrication Example 5 was used.

<Test Example 2> Measurement of Surface Resistance and Friction Coefficient of Tray Assembly The surface resistances of the tray assemblies according to Fabrication Examples 6 to 9 were measured using ASTM D257. Further, a static friction coefficient and a kinetic friction coefficient were measured using ASTM D1894. The results are shown in Table 2 below.

TABLE 2

| | | Fabrication Example 6 | Fabrication Example 7 | Fabrication Example 8 | Fabrication Example 9 |
|---|---|---|---|---|---|
| Surface resistance ($\Omega/cm^2$) | | $10^6 \sim 10^9$ | $10^6 \sim 10^9$ | $10^6 \sim 10^9$ | $10^6 \sim 10^9$ |
| Friction coefficient | Static friction coefficient | 10.12 | 1.05 | 10.27 | 0.39 |
| | Kinetic friction coefficient | 10.01 | 0.84 | 10.15 | 0.31 |

Referring to Fabrication Examples 6 to 9, the tray assemblies fabricated using the unstretched anti-slip pads including TPU/PS/TPU or TPO/PS/TPO exhibit similar surface resistances compared to the tray assembly fabricated using the PS single layer sheet, and also exhibit higher friction coefficients based on the ASTM D1894 standard. In case that the surface resistance that may be an index indicating a degree of an antistatic effect may be within a range of about $10^6$ $\Omega/cm^2$ to about $10^9$ $\Omega/cm^2$, the tray assembly may exhibit good performance.

Referring to Fabrication Examples 1 to 5, the TPO/PS/TPO unstretched anti-slip pad exhibits similar surface resistances compared to the TPU/PS/TPU unstretched anti-slip pad and also exhibit higher friction coefficients based on the ASTM D1894 standard. Hereinafter, test examples using the unstretched anti-slip pad according to Fabrication Example 4, which exhibited the highest friction coefficient based on ASTM D1894 standard, will be described.

Test Example 3: Evaluation of Heat Resistance of Fabrication Example 4

FIGS. 20A to 20D are photographs showing heat resistance evaluation results of anti-slip pads according to a fabrication example.

Figure 20A:
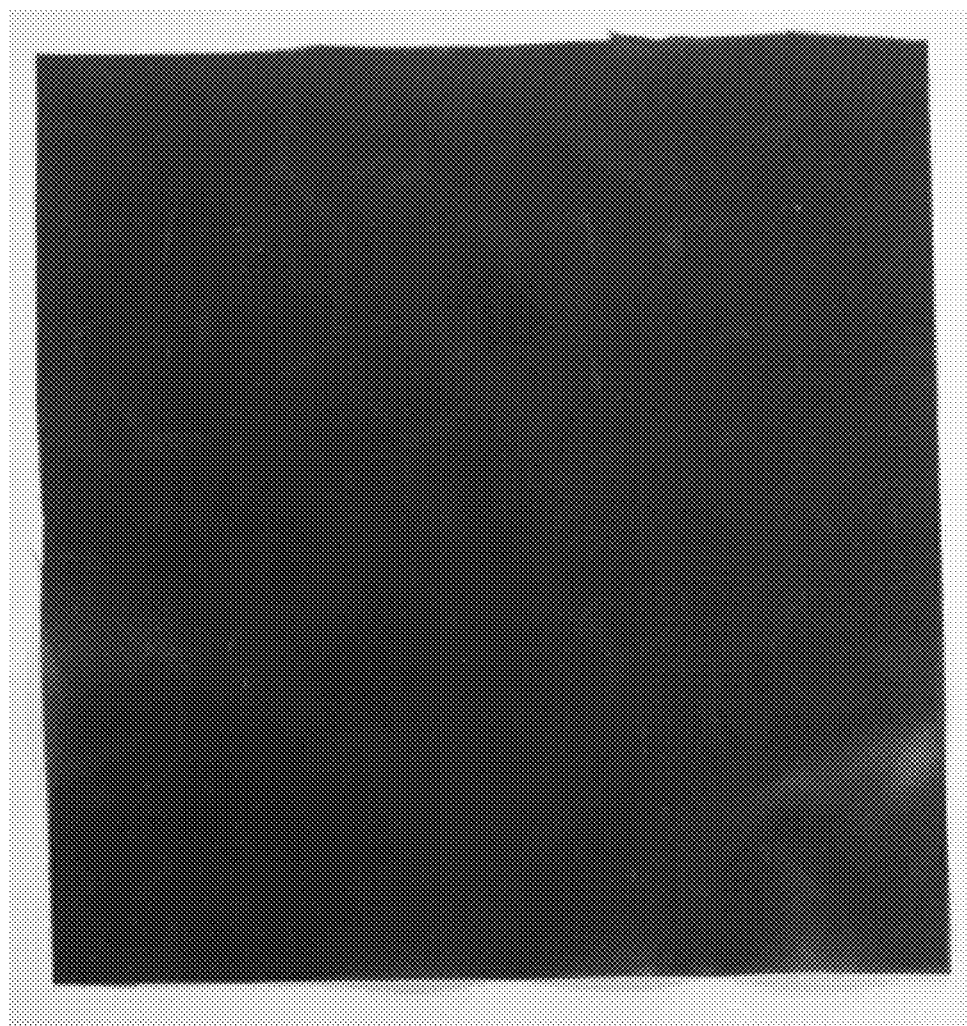
FIGS. 20A to 20D are photographs showing heat resistance evaluation results of anti-slip pads according to a fabrication example.
Figure 20B:
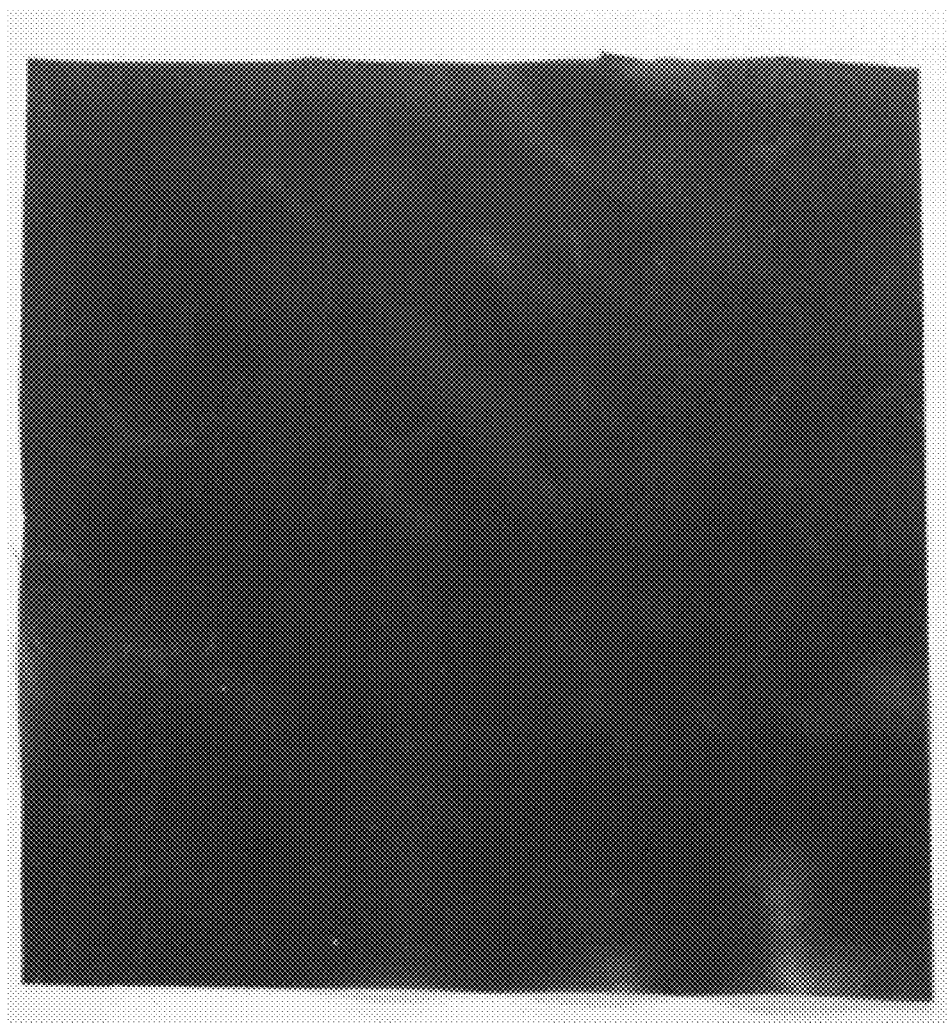
Figure 20C:
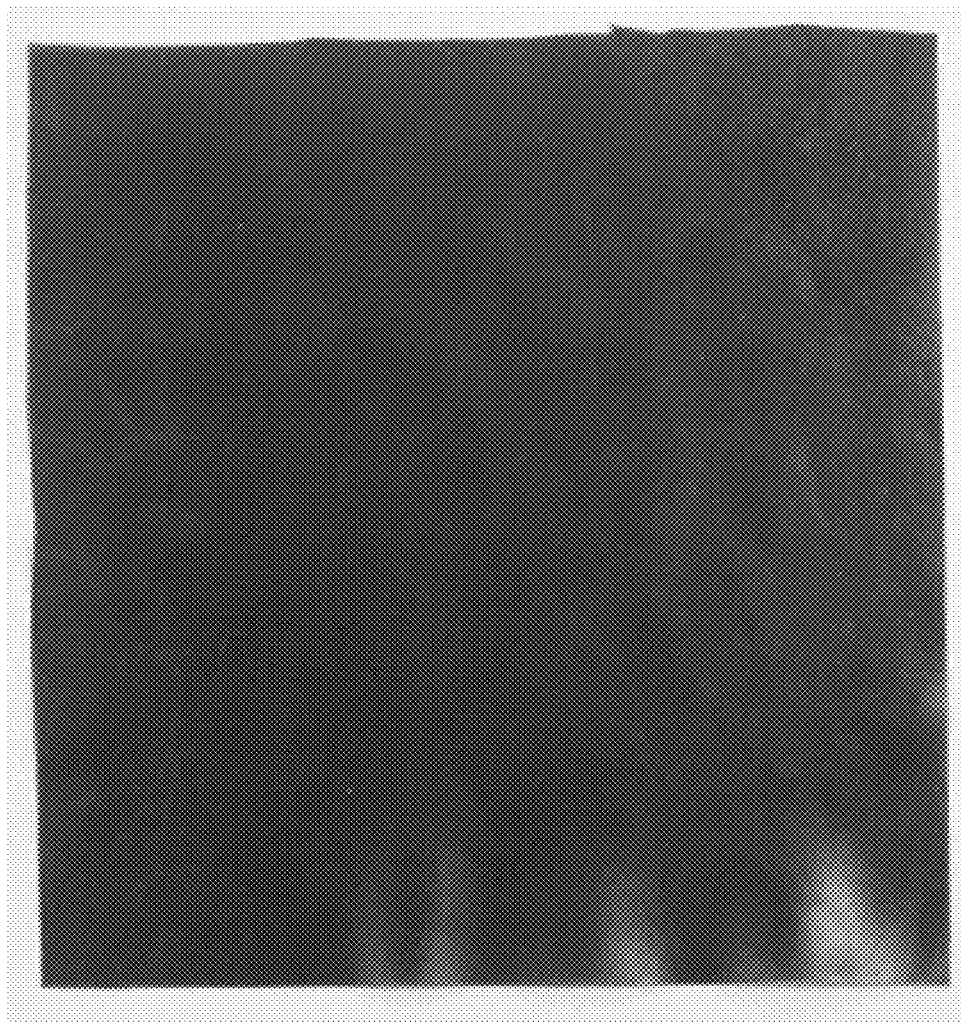
Figure 20D:
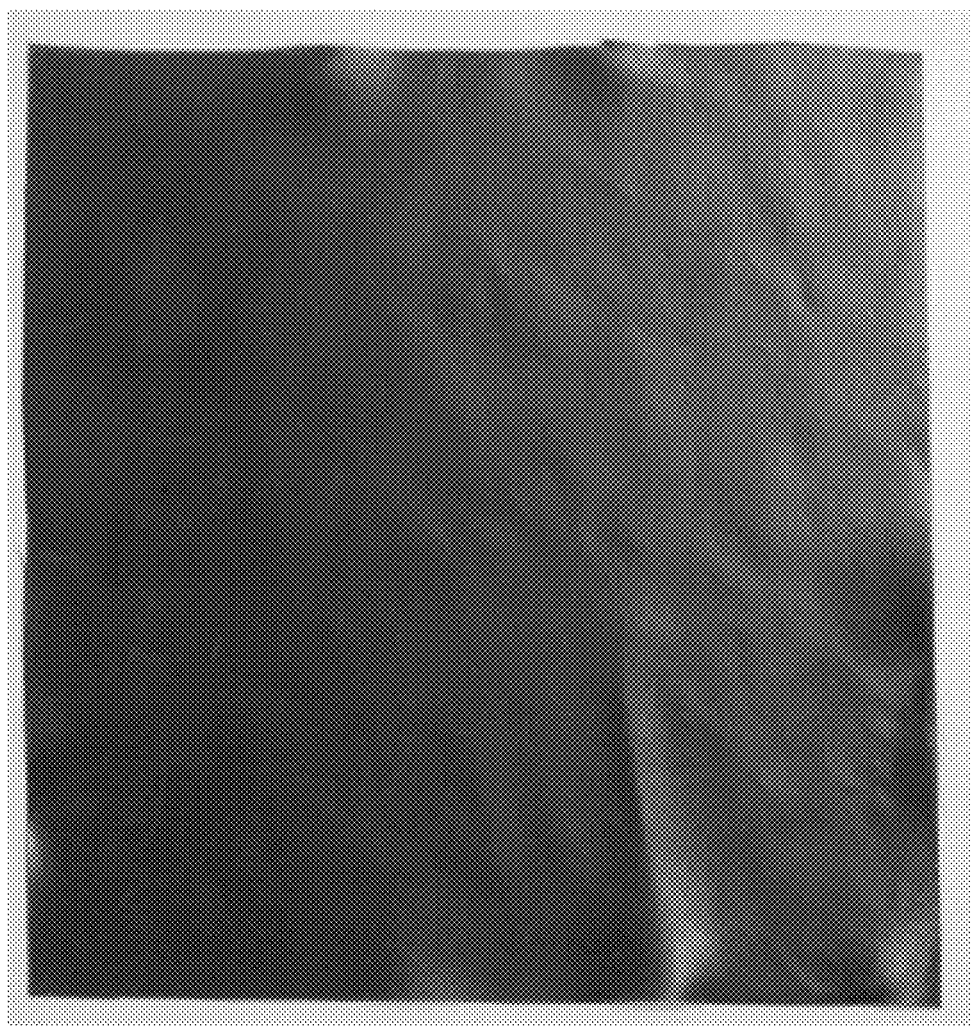

Referring to FIGS. 20A to 20D, FIG. 20A is a photograph of an anti-slip pad before heating, FIG. 20B is a photograph of an anti-slip pad heated at about 60° C. for about 10 minutes, FIG. 20C is a photograph of an anti-slip pad heated at about 100° C. for about 10 minutes, and FIG. 20D is a photograph of an anti-slip pad heated at about 140° C. for about 10 minutes.

The anti-slip pad before the heating, the anti-slip pad heated at about 60° C. for about 10 minutes, the anti-slip pad heated at about 100° C. for about 10 minutes, and the anti-slip pad heated at about 140° C. for about 10 minutes exhibit similar shapes, and no change in appearance was observed under the above heating conditions. The anti-slip pads exhibited excellent heat resistance under the above heating conditions.

Test Example 4: Evaluation of Cleaning Performance of Fabrication Example 4

Figure 21A:
FIGS. 21A to 21C are photographs showing cleaning performance evaluation results of anti-slip pads according to a fabrication example.
Figure 21B:
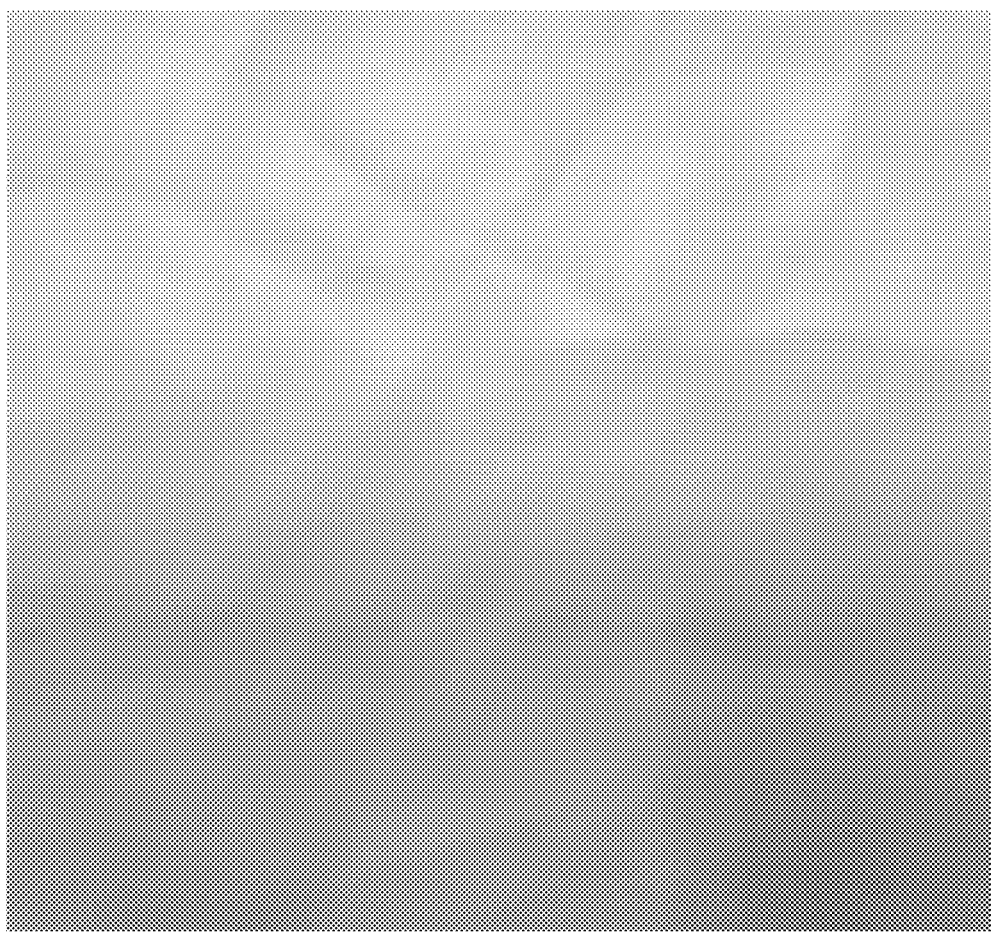
Figure 21C:
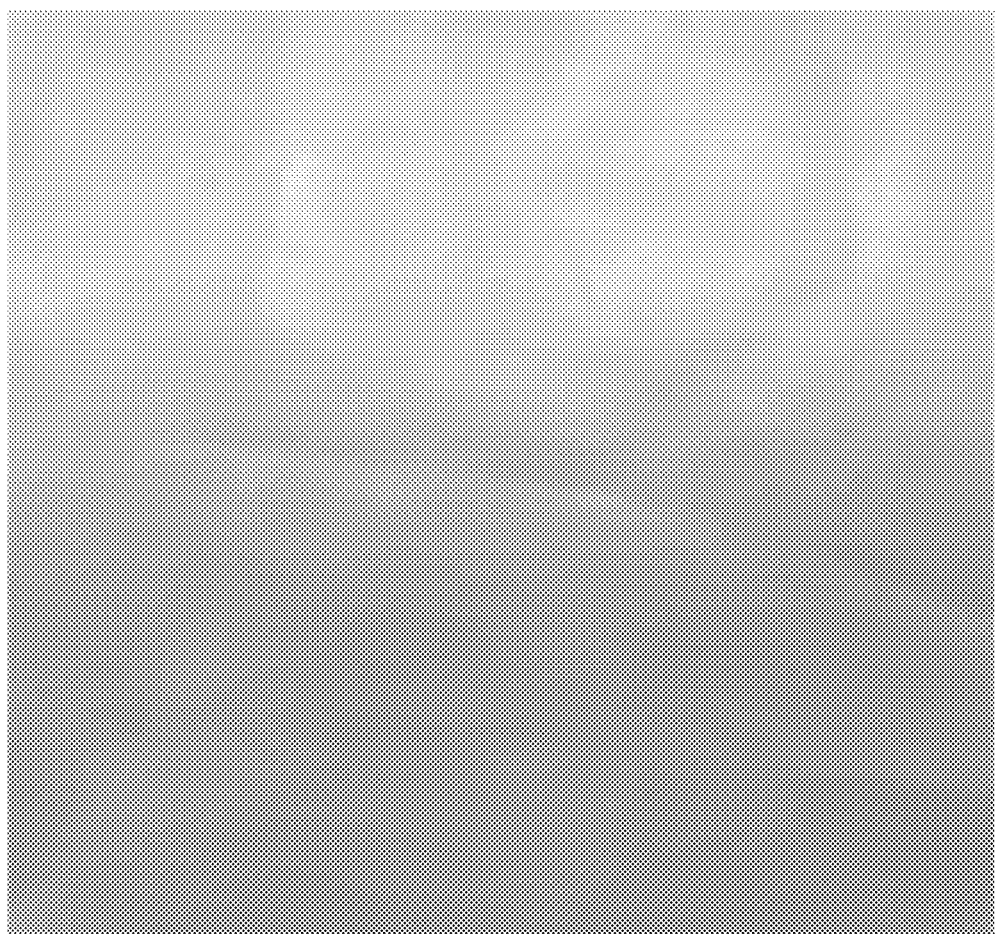

FIGS. 21A to 21C are photographs showing cleaning performance evaluation results of anti-slip pads according to one fabrication example.

Referring to 21A to 21C, FIG. 21A is a photograph of an anti-slip pad subjected to ultrasonic cleaning for about 1 minute, FIG. 21B is a photograph of an anti-slip pad subjected to ultrasonic cleaning for about 3 minutes, and FIG. 21C is a photograph of an anti-slip pad subjected to ultrasonic cleaning for about 5 minutes.

A satisfactory decontamination state was observed in all cases where the anti-slip pads according to an embodiment have been subjected to the ultrasonic cleaning for about 1 minute, about three minutes, and about five minutes. In other words, the anti-slip pad according to an embodiment exhibited excellent cleaning performance under the ultrasonic cleaning conditions.

Figure 22:
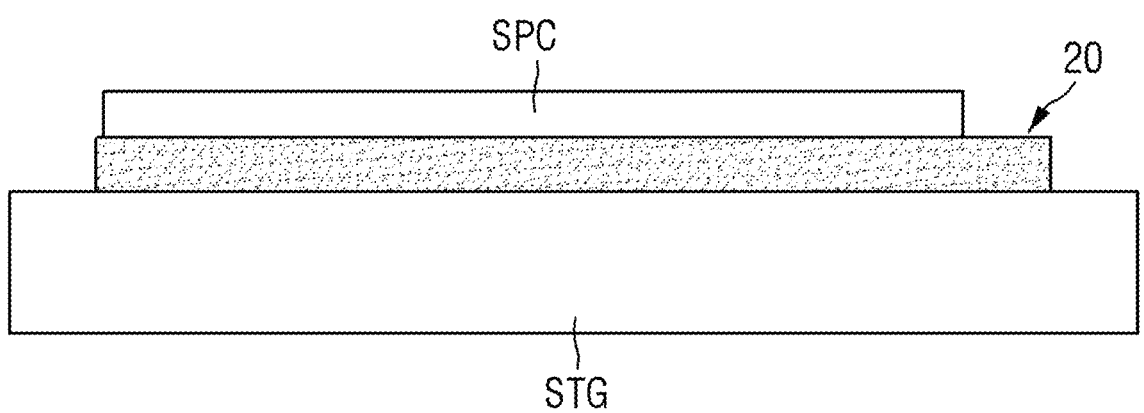
FIGS. 22 to 24 schematically show test examples for evaluating a friction coefficient of an anti-slip pad according to a fabrication example.
Figure 23:
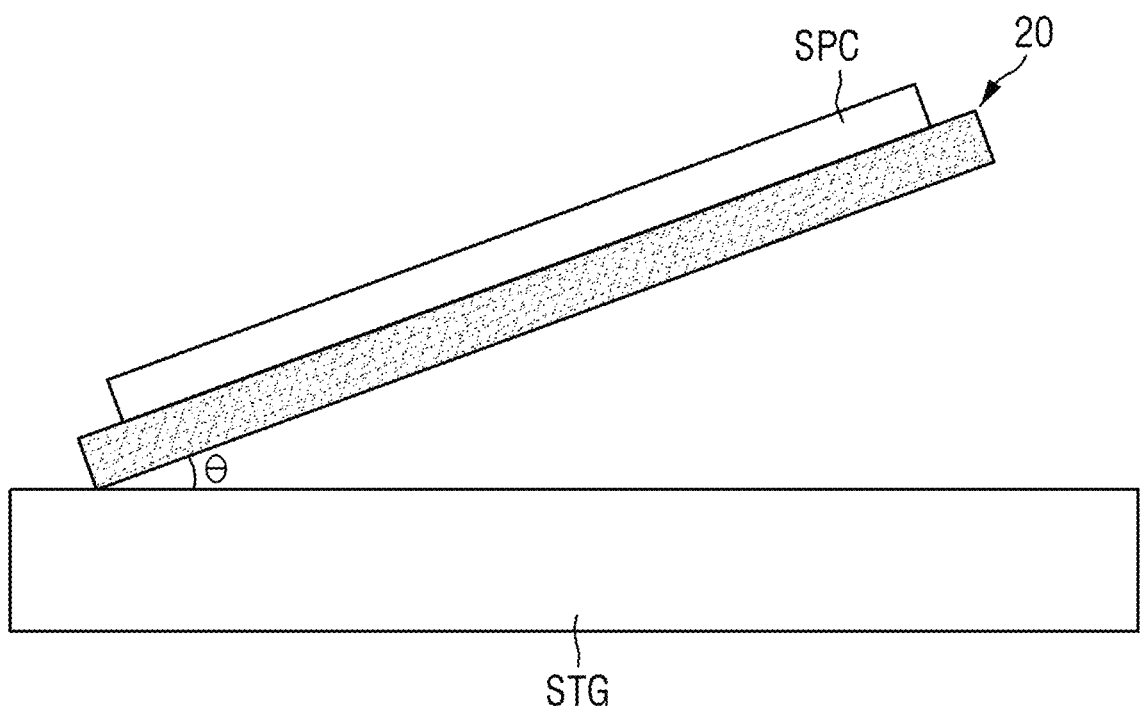
Figure 24:
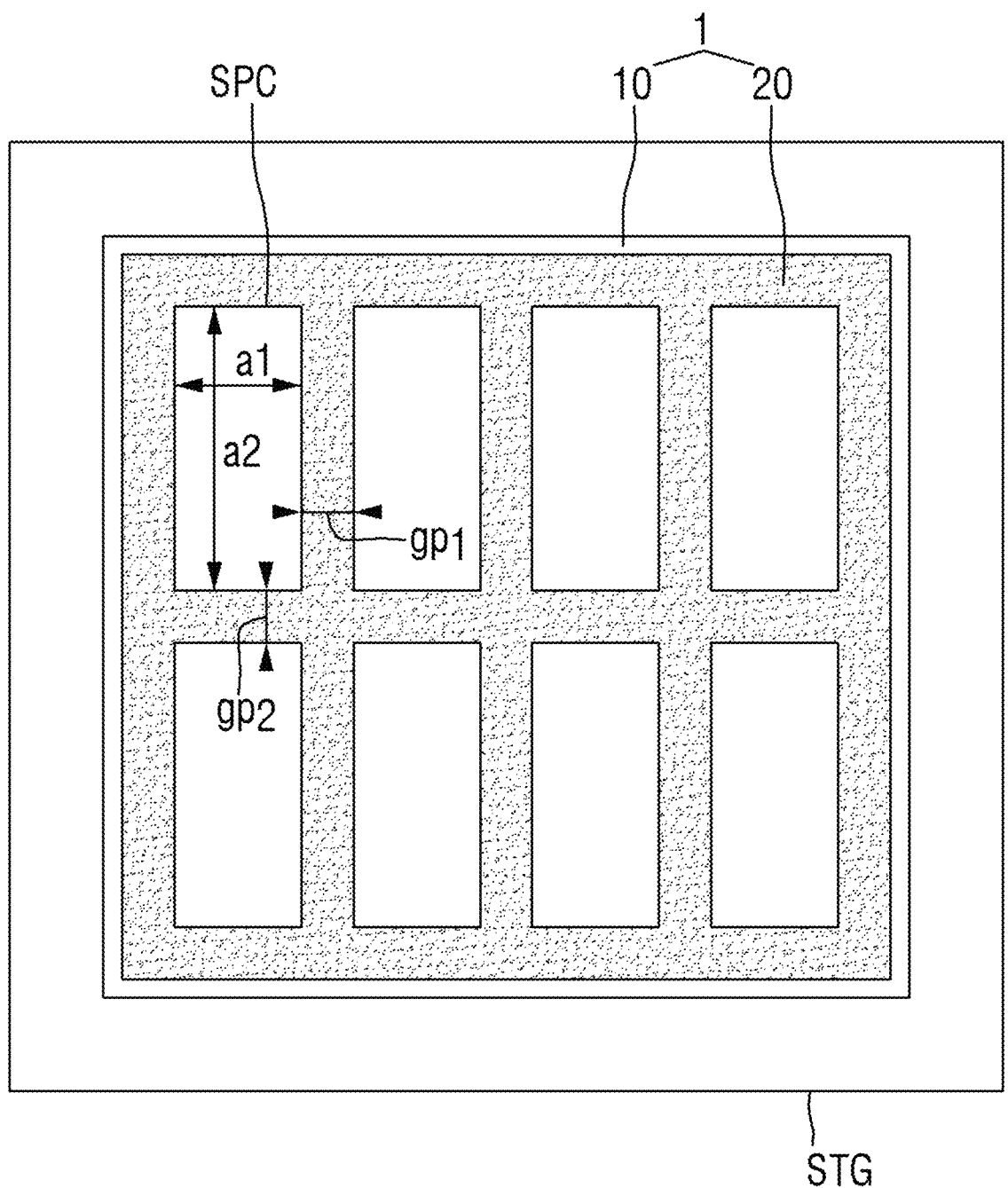

FIGS. 22 to 24 show test examples for evaluating a friction coefficient of an anti-slip pad according to one fabrication example.

Test Example 5: Measurement of Friction Coefficient of Fabrication Example 4

FIG. 22 schematically shows a test for evaluating a friction coefficient by measuring a frictional force while moving a sample SPC disposed on the anti-slip pad 20 in a horizontal direction.

Referring to FIG. 22, it is possible to calculate a static friction coefficient by measuring a force (maximum static frictional force) applied in case that the sample SPC having a weight of W and disposed on the anti-slip pad 20 starts to move by a force applied in a horizontal direction, and also possible to calculate a kinetic friction coefficient by measuring a force applied in case that the sample SPC may be moving at a constant speed.

In this test, two samples SPC, each having a horizontal size of about 4 cm and a vertical size of about 4 cm and a horizontal size of about 7.5 cm and a vertical size of about 16 cm, were used. Each of the two samples SPC has a weight of about 5 g to about 30 g. Each sample has an aluminum (Al) specimen and a PET film formed on one surface of the aluminum specimen. This test was executed in a state where the PET film of the sample SPC was in contact with the anti-slip pad.

The relationship between the static friction coefficient and the kinetic friction coefficient and the force F applied to the sample and the weight W of the sample SPC may be expressed by the following Eq. 1.

$$\mu = F \div W \quad \text{Eq. 1}$$

The static friction coefficient and the kinetic friction coefficient of the anti-slip pad 20 according to Fabrication Example 4 were about 19.34 and about 20.27, respectively, based on the ASTM D1894 standard.

Test Example 6: Measurement of Slip Inclination Angle of Fabrication Example 4

FIG. 23 schematically shows a test for observing whether or not a sample SPC disposed on the anti-slip pad slips while changing an inclination angle θ.

Referring to FIG. 23, it may be possible to measure a static friction coefficient μ of the anti-slip pad 20 by measuring an inclination angle θs at which the sample SPC starts to slip while increasing the inclination angle θ of the anti-slip pad 20. The relationship between the static friction coefficient μ of the anti-slip pad 20 and the inclination angle θs at which the anti-slip pad 20 starts to slip may be expressed by the following Eq. 2.

$$\mu = \tan \theta s \quad \text{Eq. 2}$$

According to the test result, the sample SPC may start to slip in case that the inclination angle θ of the anti-slip pad 20 may be about 70 degrees. Therefore, in this test, the static friction coefficient μ of the anti-slip pad 20 with respect to the sample SPC may be about 2.74.

Test Example 7: Evaluation of Slip Due to Vibration in Fabrication Example 4

FIG. 24 schematically shows evaluation of observing whether or not multiple samples SPC disposed on the tray assembly 1 including the anti-slip pad 20 slip in the case of vibrating a stage STG in one direction.

Referring to FIG. 24, in this vibration evaluation, specifically, whether or not the samples SPC arranged on the anti-slip pad 20 of the tray assembly 1 with a horizontal gap gp1 of about 1 cm and a vertical gap gp2 of about 1 cm slip in the case of vibrating the stage STG under a vibration acceleration of about 0.8 G (about 7.84 m/s$^2$) and a frequency of about 5 to about 100 Hz was observed.

In this test, a sample SPC having a horizontal length a1 of about 4 cm and a vertical length a2 of about 4 cm, and a sample SPC having a horizontal length a1 of about 7.5 cm and a vertical length a2 of about 16 cm were used. The weight of each sample SPC was within a range of 5 about g to about 30 g. Each sample SPC has an aluminum (Al) specimen and a PET film formed on one surface of the aluminum specimen. This test was executed in a state where the PET film of the sample SPC was in contact with the anti-slip pad 20. In this test, the anti-slip pad 20 was determined to be satisfactory in case that each sample SPC slipped by a distance of less than about 5 mm, and the anti-slip pad 20 was determined to be defective in case that each sample SPC slipped by a distance of about 5 mm or more.

In this vibration evaluation, each sample SPC slipped by a distance of less than about 5 mm, which showed that the anti-slip pad 20 according to Fabrication Example 4 used in this test may be satisfactory.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A tray assembly comprising:
   a base tray; and
   an anti-slip pad disposed on the base tray, wherein
   the anti-slip pad has a friction coefficient in a range of about 0.5 to about 20 based on ASTM D1894, and a surface resistance in a range of 10^6 Ω/cm$^2$ to 10^9 Ω/cm$^2$ based on ASTM D257, and
   the anti-slip pad includes at least one of a thermoplastic olefinic elastomer (TPO), natural rubber, styrene-butadiene rubber (SBR), and polypropylene (PP).

2. The tray assembly of claim 1, wherein the anti-slip pad further includes a composite sheet including:
   thermoplastic polymer resin; and
   a thermoplastic elastomer.

3. The tray assembly of claim 2, wherein the composite sheet includes:
   a base sheet; and
   non-slip sheets disposed on a surface and another surface of the base sheet.

4. The tray assembly of claim 3, wherein
   the base sheet includes thermoplastic polymer resin, and
   the non-slip sheets include a thermoplastic elastomer.

5. The tray assembly of claim 4, wherein the base sheet includes at least one of polyester (PET A, PET G, PET G-PET A-PET G), styrene butadiene copolymer (SBC), acrylonitrile-butadiene styrene (ABS), polystyrene (PS), polyimide (PI), polyamide, polysulfonate, polycarbonate, polyacrylate, polyvinyl chloride, polyethylene, polypropylene, modified polyphenylene oxide (M-PPO), phenol resin, epoxy resin, urethane resin, copolymers thereof, and blends thereof.

6. The tray assembly of claim 4, wherein the non-slip sheets include at least one of a thermoplastic olefinic elastomer (TPO), natural rubber, styrene-butadiene rubber (SBR), and polypropylene (PP).

7. The tray assembly of claim 3, further comprising an antistatic layer disposed on the composite sheet.

8. The tray assembly of claim 7, wherein the antistatic layer includes at least one of polyaniline, polypyrrole, polythiophene, poly(3,4-ethylenethiophene), π-conjugated electrically conductive polymer, and inherently dissipative polymer (IDP).

9. The tray assembly of claim 1, wherein the base tray includes:
   a bottom surface portion including a pattern including a groove; and
   a sidewall surrounding the bottom surface portion.

10. The tray assembly of claim 9, wherein
    the pattern includes a rib disposed in the groove, and
    a top surface of the rib and the bottom surface portion are disposed on a same plane.

11. The tray assembly of claim 9, wherein
    the pattern includes a cylindrical post disposed at a center of the groove, and a top surface of the cylindrical post and the bottom surface portion are disposed on a same plane.

12. The tray assembly of claim 1, wherein the base tray has a rectangular shape with a horizontal length and a vertical length of about 400 mm to about 600 mm in plan view, and has a deflection amount of less than about 1 mm.

* * * * *

UNITED STATES PATENT AND TRADEMARK OFFICE
CERTIFICATE OF CORRECTION

| | | |
|---|---|---|
| PATENT NO. | : 12,012,272 B2 | Page 1 of 1 |
| APPLICATION NO. | : 17/470416 | |
| DATED | : June 18, 2024 | |
| INVENTOR(S) | : Sung Kim et al. | |

It is certified that error appears in the above-identified patent and that said Letters Patent is hereby corrected as shown below:

On the Title Page

Please add "Ji Soo Kim Seoul, (KR)" as an inventor.

Signed and Sealed this
Fifth Day of November, 2024

Katherine Kelly Vidal
*Director of the United States Patent and Trademark Office*